(12) United States Patent
Ono

(10) Patent No.: US 10,429,865 B2
(45) Date of Patent: Oct. 1, 2019

(54) TEMPERATURE CONTROL APPARATUS

(71) Applicant: Shinwa Controls Co., Ltd., Kawasaki-Shi (JP)

(72) Inventor: Shigehiko Ono, Kawasaki (JP)

(73) Assignee: Shinwa Controls Co., Ltd., Kawasaki-Shi (JP)

(*) Notice: Subject to any disclaimer, the term of this patent is extended or adjusted under 35 U.S.C. 154(b) by 71 days.

(21) Appl. No.: 15/534,229

(22) PCT Filed: Oct. 31, 2016

(86) PCT No.: PCT/JP2016/082253
§ 371 (c)(1),
(2) Date: Jun. 8, 2017

(87) PCT Pub. No.: WO2017/077975
PCT Pub. Date: May 11, 2017

(65) Prior Publication Data
US 2017/0357277 A1    Dec. 14, 2017

(30) Foreign Application Priority Data

Nov. 6, 2015 (JP) .................................. 2015-218429

(51) Int. Cl.
*G05D 23/19* (2006.01)
*F15B 13/04* (2006.01)
(Continued)

(52) U.S. Cl.
CPC ..... *G05D 23/1951* (2013.01); *F15B 13/0402* (2013.01); *F16K 11/22* (2013.01);
(Continued)

(58) Field of Classification Search
CPC .. F16K 11/22; F16K 51/02; F28D 2021/0077; F28F 13/06; F28F 27/02;
(Continued)

(56) References Cited

U.S. PATENT DOCUMENTS

2001/0022196 A1* 9/2001 Fagerstrom ......... F15B 13/0402
137/596.18
2005/0151553 A1* 7/2005 Kabbani ............ G01R 31/2891
324/750.08
(Continued)

FOREIGN PATENT DOCUMENTS

JP    2001-134324 A1    5/2001
JP    2001-263506 A1    9/2001
(Continued)

OTHER PUBLICATIONS

International Search Report and Written Opinion (Application No. PCT/JP2016/082253) dated Jan. 24, 2017.
(Continued)

*Primary Examiner* — Henry T Crenshaw
(74) *Attorney, Agent, or Firm* — Burr & Brown, PLLC

(57) ABSTRACT

A temperature control apparatus is provided, which is capable of, even when it is necessary to perform control by means of valves in a plurality of channels, promptly controlling a temperature of an area to be temperature-controlled promptly to a desired temperature. Passage and blockage of a heating medium passing through a first supply channel to a mixing channel, a temperature of the heating medium being controlled by a first temperature regulating unit at a predetermined temperature, and passage and blockage of a heating medium passing through a second supply channel to the mixing channel, a temperature of the heating medium being controlled by a second temperature regulating unit, are controlled by a valve unit. The valve unit includes a first spool valve and a second spool valve, which are coupled through a heat insulating layer.

18 Claims, 7 Drawing Sheets

(51) Int. Cl.
*F16K 11/22* (2006.01)
*F16K 51/02* (2006.01)
*F28F 13/06* (2006.01)
*F28F 27/02* (2006.01)
*G05D 7/06* (2006.01)
*G05D 23/13* (2006.01)
*G05D 23/30* (2006.01)
*G05D 23/185* (2006.01)
*F28D 21/00* (2006.01)
*H01L 21/67* (2006.01)
*H01L 21/3065* (2006.01)

(52) U.S. Cl.
CPC ............. *F16K 51/02* (2013.01); *F28F 13/06* (2013.01); *F28F 27/02* (2013.01); *G05D 7/0623* (2013.01); *G05D 23/1393* (2013.01); *G05D 23/1858* (2013.01); *G05D 23/306* (2013.01); *F28D 2021/0077* (2013.01); *H01L 21/3065* (2013.01); *H01L 21/67248* (2013.01)

(58) Field of Classification Search
CPC ........... G05D 23/1393; G05D 23/1858; G05D 23/1951; G05D 23/306; G05D 7/0623; H01L 21/3065; H01L 21/67248; F15B 13/0402
USPC ....................................................... 165/294
See application file for complete search history.

(56) References Cited

U.S. PATENT DOCUMENTS

| | | | | |
|---|---|---|---|---|
| 2007/0267188 | A1* | 11/2007 | Di Stefano | G05D 23/1393 165/296 |
| 2008/0223555 | A1* | 9/2008 | Di Stefano | F25B 49/02 165/101 |
| 2008/0314564 | A1* | 12/2008 | Nagaseki | G05D 23/19 165/104.31 |
| 2010/0116484 | A1* | 5/2010 | Kokubo | F25D 17/02 165/201 |
| 2011/0066294 | A1* | 3/2011 | Takechi | H01L 21/67005 700/282 |
| 2014/0262199 | A1* | 9/2014 | Kobayashi | G05D 23/1934 165/294 |
| 2015/0176928 | A1* | 6/2015 | Tabuchi | G05D 23/1393 165/96 |

FOREIGN PATENT DOCUMENTS

| | | |
|---|---|---|
| JP | 2011-149474 A1 | 8/2011 |
| JP | 2013-076486 A1 | 4/2013 |
| JP | 2013-105359 A1 | 5/2013 |
| JP | 2014-021828 A1 | 2/2014 |

OTHER PUBLICATIONS

English translation of International Preliminary Report on Patentability (Chapter I) (Application No. PCT/JP2016/082253) dated May 17, 2018, 8 pages.

* cited by examiner

TEMPERATURE CONTROL APPARATUS

BACKGROUND OF THE INVENTION

Field of the Invention

The present invention relates to a temperature control apparatus.

Background Art

A plasma treatment apparatus that removes a resist applied to a substrate upon manufacture of a semiconductor by plasma etching has been conventionally known. Generally, the plasma treatment apparatus includes a substrate holding unit for holding a substrate, and a high-frequency power source for applying a high-frequency power to generate plasma, and is configured to temperature-control the substrate holding unit such that the substrate has a desired temperature.

As an apparatus for temperature-controlling a member such as the aforementioned substrate holding unit, Patent Document 1 discloses a temperature control system that mixes a liquid supplied from a low-temperature channel, a temperature of which is adjusted at a first temperature, a liquid supplied from a high-temperature channel, a temperature of which is adjusted at a second temperature, and a liquid supplied from a bypass channel, and supplies the mixed liquids to a temperature adjusting device. In the temperature control system, by connecting a low-temperature channel, a high-temperature channel and a bypass channel to each of a plurality of temperature adjusting devices, a plurality of areas to be temperature-controlled can be temperature-controlled.

Patent Document 1: JP2013-105359A

SUMMARY OF THE INVENTION

In the temperature control system disclosed in Patent Document 1, each of the low-temperature channel, the high-temperature channel and the bypass channel is equipped with a variable valve for adjusting a flow rate. A liquid going out from the temperature adjusting device circulates respectively in the low-temperature channel, the high-temperature channel and the bypass channel, through three-diverging channels, and each of the diverging channels is equipped with a check valve. However, as the number of areas to be temperature-controlled increases, the number of such valves increases. Thus, when there are a large number of areas to be temperature-controlled, the system as a whole may be significantly complicated and enlarged.

On the other hand, when a resist applied to a substrate is plasma-etched upon manufacture of a semiconductor, for example, by promptly and precisely controlling a temperature of the substrate with a resist applied thereon to a desired temperature, a product throughput can be improved. Thus, there is a strong demand for the temperature control apparatus or system of this type to control a temperature to a desired one promptly and precisely as much as possible.

The present invention has been made in view of such circumstances. The object of the present invention is to provide a temperature control apparatus capable of promptly controlling a temperature of an area to be temperature-controlled to a desired temperature, while avoiding complication and enlargement of the apparatus as a whole even when it is necessary to perform control by means of valves in a plurality of channels.

The temperature control apparatus according to the present invention is a temperature control apparatus comprising: a first temperature regulating unit including a first supply channel through which a heating medium passes; a second temperature regulating unit including a second supply channel through which a heating medium passes, the heating medium being controlled at a temperature different from that of the heating medium passing through the first supply channel; a valve unit connected to the first supply channel and the second supply channel; a mixing channel connected to the valve unit, through which at least one of the heating medium passing through the first supply channel to go out from the valve unit, and the heating medium passing through the second supply channel to go out from the valve unit passes; and a temperature adjusting device that temperature-controls a predetermined member, by passing therethrough the heating medium going out from the mixing channel; wherein: the valve unit includes a first spool valve that switches passage and blockage of the heating medium from the first supply channel to the mixing channel, and a second spool valve that switches passage and blockage of the heating medium from the second supply channel to the mixing channel; and the first spool valve and the second spool valve are coupled through a heat insulating layer.

The temperature control apparatus according to the present invention may further comprise a first circulation channel and a second circulation channel that extend and diverge from the temperature adjusting device, through which the heating medium going out from the temperature adjusting device passes, wherein: the first spool valve may be connected to the first circulation channel, while the second spool valve is connected to the second circulation channel; the first spool valve may include a first outlet port for return from which the heating medium from the first circulation channel goes out, the first spool valve being configured to switch passage and blockage of the heating medium from the first circulation channel to the first outlet port for return, according as switching of passage and blockage of the heating medium from the first supply channel to the mixing channel; and the second spool valve may include a second outlet port for return from which the heating medium from the second circulation channel goes out, the second spool valve being configured to switch passage and blockage of the heating medium from the second circulation channel to the second outlet port for return, according as switching of passage and blockage of the heating medium from the second supply channel to the mixing channel.

The first spool valve may be configured to cause the heating medium to pass from the first circulation channel to the first outlet port for return, when the first spool valve causes the heating medium to pass from the first supply channel to the mixing channel, as well as the first spool valve is configured to block the heating medium from the first circulation channel to the first outlet port for return, when the first spool valve blocks the heating medium from the first supply channel to the mixing channel; and the second spool valve may be configured to cause the heating medium to pass from the second circulation channel to the second outlet port for return, when the second spool valve causes the heating medium to pass from the second supply channel to the mixing channel, as well as the second spool valve is configured to block the heating medium from the second circulation channel to the second outlet port for return, when the second spool valve blocks the heating medium from the second supply channel to the mixing channel.

The first spool valve further may include a first inlet port for supply connecting to the first supply channel, a first outlet port for supply connecting to the mixing channel, and a first inlet port for return connecting to the first circulation channel; the first spool valve may be configured to connect the first inlet port for supply and the first outlet port for return, when the first spool valve blocks the first inlet port for supply and the first outlet port for supply so as to block the heating medium from the first supply channel to the mixing channel, and blocks the first inlet port for return and the first outlet port for return so as to block the heating medium from the first circulation channel to the first outlet port for return; the second spool valve may further include a second inlet port for supply connecting to the second supply channel, a second outlet port for supply connecting to the mixing channel, and a second inlet port for return connecting to the second circulation channel; and the second spool valve may be configured to connect the second inlet port for supply and the second outlet port for return, when the second spool valve blocks the second inlet port for supply and the second outlet port for supply so as to block the heating medium from the second supply channel to the mixing channel, and blocks the second inlet port for return and the second outlet port for return so as to block the heating medium from the second circulation channel to the second outlet port for return.

The temperature control apparatus according to the present invention may further comprise a valve control device that controls operations of the first spool valve and the second spool valve in the valve unit, wherein: when the valve control device controls the first spool valve such that the heating medium passes from the first supply channel to the mixing channel, the valve control device controls the second spool valve such that the heating medium from the second supply channel to the mixing channel is blocked; and when the valve control device controls the second spool valve such that the heating medium passes from the second supply channel to the mixing channel, the valve control device controls the first spool valve such that the heating medium from the first supply channel to the mixing channel is blocked.

In this case, each of the first spool valve and the second spool valve may have an electromagnetic solenoid that switches two positions depending on an excitation condition and a non-excitation condition, each of the first spool valve and the second spool valve being configured to switch passage and blockage of the heating medium depending on the position of the electromagnetic solenoid; and when the valve control device controls the electromagnetic solenoid of the first spool valve so as to be in one of the excitation condition and the non-excitation condition, the valve control device may control the electromagnetic solenoid of the second spool valve so as to be in the other one of the excitation condition and the non-excitation condition.

In the temperature control apparatus according to the present invention, the first spool valve may be configured to switch passage and blockage of the heating medium from the first supply channel to the mixing channel in such a manner that a flow rate of the heating medium passing from the first supply channel to the mixing channel can be adjusted, while the second spool valve is configured to switch passage and blockage of the heating medium from the second supply channel to the mixing channel in such a manner that a flow rate of the heating medium from the second supply channel to the mixing channel can be adjusted; the first spool valve may further include a first inlet port for supply connecting to the first supply channel, a first outlet port for supply connecting to the mixing channel, and a first inlet port for return connecting to the first circulation channel; the first spool valve may be configured to adjust a flow rate of the heating medium passing from the first supply channel to the mixing channel by adjusting connection between the first inlet port for supply and the first outlet port for supply at an opening degree between a full open condition and a full close condition, while the first spool valve is configured to adjust a flow rate of the heating medium passing from the first circulation channel to the first outlet port for return to go out therefrom by adjusting connection between the first inlet port for return and the first outlet port for return at an opening degree between a full open condition and a full close condition, in such a manner that the opening degree in the connection between the first inlet port for return and the first outlet port for return increases, as the opening degree in the connection between the first inlet port for supply and the first outlet for supply increases; the second spool valve may further include a second inlet port for supply connecting to the second supply channel, a second outlet port for supply connecting to the mixing channel, and a second inlet port for return connecting to the second circulation channel; and the second spool valve may be configured to adjust a flow rate of the heating medium passing from the second supply channel to the mixing channel by adjusting connection between the second inlet port for supply and the second outlet port for supply at an opening degree between a full open condition and a full close condition, while the second spool valve is configured to adjust a flow rate of the heating medium passing from the second circulation channel to the second outlet port for return to go out therefrom by adjusting connection between the second inlet port for return and the second outlet port for return at an opening degree between a full open condition and a full close condition, in such a manner that the opening degree in the connection between the second inlet port for return and the second outlet port for return increases, as the opening degree in the connection between the second inlet port for supply and the second outlet port for supply increases.

In the temperature control apparatus according to the present invention, the first spool valve may be configured to connect the first inlet port for supply and the first outlet port for return in a full open condition, when the connection between the first inlet port for supply and the first outlet port for supply is in the full close condition and the connection between the first inlet port for return and the first outlet port for return is in the full close condition; the connection between the first inlet port for supply and the first outlet port for return may come close to a full close condition, as the connection between the first inlet port for supply and the first outlet port for supply and the connection between the first inlet port for return and the first outlet port for return come close to the full open condition, in such a manner that the connection between the first inlet port for supply and the first outlet port for return reaches the full close condition when the connection between the first inlet port for supply and the first outlet port for supply reaches the full open condition and the connection between the first inlet port of return and the first outlet port for return reaches the full open condition; the second spool valve may be configured to connect the second inlet port for supply and the second outlet port for return in a full open condition, when the connection between the second inlet port for supply and the second outlet port for supply is in the full close condition and the connection between the second inlet port for return and the second outlet port for return is in the full close condition; and the connection between the second inlet port for supply and the second outlet port for return may come close to a full close condition, as connection between the second inlet port for supply and the second outlet port for supply and the connection between the second inlet port for return and the second outlet port for return come close to the full open condition, in such a manner that the connection between the second inlet port for supply and the second outlet port for return reaches the full close condition when the connection between the second inlet port for supply and the second outlet port for supply reaches the full open condition and the second inlet port for return and the connection between the second outlet port for return reaches the full open condition.

The temperature control apparatus according to the present invention may further comprise a valve control device that controls operations of the first spool valve and the second spool valve in the valve unit, wherein: the first spool valve and the second spool valve have the same structure with each other; and when the valve control device controls an opening degree in the connection between the first inlet port for supply and the first outlet port for supply of the first spool valve at A % that is between 0% and 100%, the valve control device controls an opening degree in the connection between the second inlet port for supply and the second outlet port for supply of the second spool valve at (100−A) %.

In the temperature control apparatus according to the present invention, each of the first spool valve and the second spool valve may have a proportional solenoid, and may be configured to adjust a flow rate depending on driving of the proportional solenoid.

In the temperature control apparatus according to the present invention, the first temperature regulating unit may further include: a first return channel connected to the first outlet port for return, through which the heating medium going out from the first outlet port for return passes; a first intermediate channel interposed between the first return channel and the first supply channel; a first cooling device that cools the heating medium at any position in a portion including the first return channel up to an upstream end of the first supply channel; and a first heating device that heats the heating medium on the downstream side of a cooled position of the first cooling device in the portion including the first return channel up to the upstream end of the first supply channel; and the heating medium passing through the first supply channel is temperature-controlled by the first cooling device and the first heating device.

In the temperature control apparatus according to the present invention, the first return channel and the first intermediate channel may be connected by a first side three-way valve; the first intermediate channel may include a first side main channel part and a first side bypass channel part; the first side three-way valve may be connected, at a first port thereof, to a downstream end of the first return channel, may be connected, at a second port thereof, to an upstream end of the first side main channel part, and may be connected, at a third port thereof, to an upstream end of the first side bypass channel part; the heating medium passing through the first side main channel part may be cooled by the first cooling device; a downstream end of the first side main channel part may be connected to the first heating device; the first heating device may receive and heat the heating medium going out from the first side main channel part; and the first side bypass channel part may be connected to a position that is on the downstream side of the cooled position of the first cooling device in the first side main channel part and on the upstream side of the connection position to the first heating device.

In the temperature control apparatus according to the present invention, the second temperature regulating unit may further include: a second return channel connected to the second outlet port for return, through which the heating medium going out from the second outlet port for return passes; a second intermediate channel interposed between the second return channel and the second supply channel; a second cooling device that cools the heating medium at any position in a portion including the second return channel up to an upstream end of the second supply channel; and a second heating device that heats the heating medium on the downstream side of a cooled position of the second cooling device in the portion including the second return channel up to the upstream end of the second supply channel; and the heating medium passing through the second supply channel is temperature-controlled by the second cooling device and the second heating device.

In the temperature control apparatus according to the present invention, the second return channel and the second intermediate channel may be connected by a second side three-way valve; the second intermediate channel may include a second side main channel part and a second side bypass channel part; the second side three-way valve may be connected, at a first port thereof, to a downstream end of the second return channel, may be connected, at a second port thereof, to an upstream end of the second side main channel part, and may be connected, at a third port thereof, to an upstream end of the second side bypass channel part; the heating medium passing through the second side main channel part may be cooled by the second cooling device; a downstream end of the second side main channel part is connected to the second heating device; the second heating device receives and heats the heating medium going out from the second side main channel part; and the second side bypass channel part is connected to a position that is on the downstream side of the cooled position of the second cooling device in the second side main channel part and on the upstream side of the connection position to the second heating device.

The temperature control apparatus according to the present invention may further comprise in addition to the first circulation channel and the second circulation channel, a third circulation channel that extends and diverges from the temperature adjusting device, through which the heating medium going out from the temperature adjusting device passes, wherein: the valve unit further may include a third spool valve connected to the third circulation channel; the third spool valve may have a third outlet port for return through which the heating medium from the third circulation channel goes out, and may be configured to switch passage and blockage of the heating medium from the third circulation channel to the third outlet port for return; and the third outlet port for return is connected to the mixing channel.

The third spool valve may be connected to any of the first spool valve and the second spool valve.

In addition, in the temperature control apparatus according to the present invention, the first spool valve may include a first valve body having a spool hole formed therein, and a first spool inserted into the spool hole of the first valve body; the second spool valve may include a second valve body having a spool hole formed therein, and a second spool inserted into the spool hole of the second valve body; and the first spool valve and the second spool valve may be located such that the first spool and the second spool are coaxial, and the heat insulating layer is disposed between an end of the first valve body and an end of the second valve body, the ends facing with each other.

In addition, a temperature control apparatus according to the present invention comprises: a first temperature regulating unit including a first supply channel through which a heating medium passes; a second temperature regulating unit including a second supply channel through which a heating medium passes, the heating medium being controlled at a temperature different from that of the heating medium passing through the first supply channel; a valve unit connected to the first supply channel and the second supply channel; a mixing channel connected to the valve unit, through which at least one of the heating medium passing through the first supply channel to go out from the valve unit, and the heating medium passing through the second supply channel to go out from the valve unit passes; and a temperature adjusting device that temperature-controls a predetermined member, by passing therethrough the heating medium going out from the mixing channel; wherein: the valve unit includes a first spool valve that switches passage and blockage of the heating medium from the first supply channel to the mixing channel, and a second spool valve that switches passage and blockage of the heating medium from the second supply channel to the mixing channel, the first spool valve and the second spool valve being coupled to each other, the temperature control apparatus further comprises a first circulation channel and a second circulation channel that extend and diverge from the temperature adjusting device, through which the heating medium going out from the temperature adjusting device passes; the first spool valve is connected to the first circulation channel, while the second spool valve is connected to the second circulation channel; the first spool valve includes a first outlet port for return from which the heating medium from the first circulation channel goes out, the first spool valve being configured to switch passage and blockage of the heating medium from the first circulation channel to the first outlet port for return, according as switching of passage and blockage of the heating medium from the first supply channel to the mixing channel; and the second spool valve includes a second outlet port for return from which the heating medium from the second circulation channel goes out, the second spool valve being configured to switch passage and blockage of the heating medium from the second circulation channel to the second outlet port for return, according as switching of passage and blockage of the heating medium from the second supply channel to the mixing channel.

According to the temperature control apparatus of the present invention, even when it is necessary to perform control by means of valves in a plurality of channels, a temperature of an area to be temperature-controlled can be promptly controlled to a desired temperature, while complication and enlargement of the apparatus as a whole can be avoided.

DETAILED DESCRIPTION OF THE INVENTION

Respective embodiments of the present invention are described in detail herebelow with reference to the drawings.

First Embodiment

Figure 1:
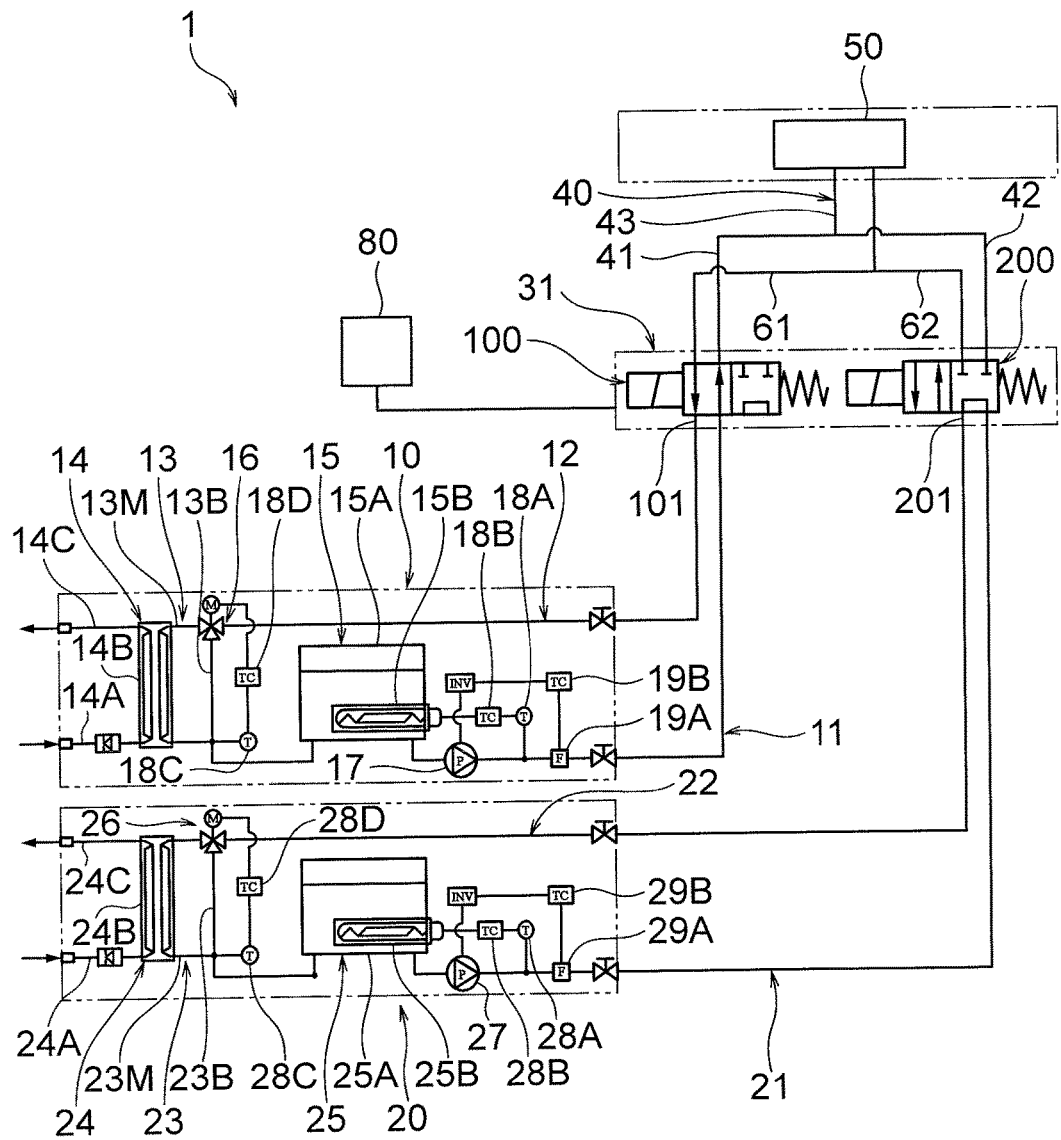
FIG. 1 is a schematic view of a temperature control apparatus according to a first embodiment of the present invention.

FIG. 1 is an overall schematic view of a temperature control apparatus 1 according to a first embodiment of the present invention. The temperature control apparatus 1 is used for, for example, temperature-controlling a substrate holding unit of a plasma treatment apparatus which removes a resist applied to a substrate upon manufacture of a semiconductor by plasma etching, so as to temperature-control the substrate held on the substrate holding unit to a desired temperature.

<Schematic Structure of Temperature Control Apparatus>

A schematic structure of the temperature control apparatus 1 is firstly described.

As shown in FIG. 1, the temperature control apparatus 1 according to this embodiment comprises: a first temperature regulating unit 10 including a first supply channel 11 through which a heating medium passes; a second temperature regulating unit 20 including a second supply channel 21 through which a heating medium passes, the heating medium being controlled at a temperature different from that of the heating medium passing through the first supply channel 11; a valve unit 31 connected to the first supply channel 11 and the second supply channel 21; a mixing channel 40 connected to the valve unit 31, through which at least one of the heating medium passing through the first supply channel 11 to go out from the valve unit 31 and the heating medium passing through the second supply channel 21 to go out from the valve unit 31 passes; and a temperature adjusting device 50 that temperature-controls a predetermined member, such as the aforementioned substrate holding unit in the plasma treatment apparatus, by passing therethrough the heating medium going out from the mixing channel 40.

The valve unit 31 includes a first spool valve 100 that switches passage and blockage of the heating medium from the first supply channel 11 to the mixing channel 40, and a second spool valve 200 that switches passage and blockage of the heating medium from the second supply channel 21 to the mixing channel 40. In this embodiment, the first spool valve 100 is configured to switch passage and blockage of the heating medium from the first supply channel 11 to the mixing channel 40, in such a manner that a flow rate of the heating medium passing from the first supply channel 11 to the mixing channel 40 can be adjusted. Similarly, the second spool valve 200 is configured to switch passage and blockage of the heating medium from the second supply channel 21 to the mixing channel 40, in such a manner that a flow rate of the heating medium passing from the second supply channel 21 to the mixing channel 40 can be adjusted.

In addition, in this embodiment, the mixing channel 40 includes a first channel part 41 connected to the first spool valve 100, a second channel part 42 connected to the second spool valve 200, and a mixing unit body 43 connected to the first channel part 41 and the second channel part 42 from which the heating medium goes out into the temperature adjusting device 50. Thus, in this example, the first spool valve 100 adjusts a flow rate of the heating medium passing from the first supply channel 11 to the first channel part 41 of the mixing channel 40, while the second spool valve 20 adjusts a flow rate of the heating medium passing from the second supply channel 21 to the second channel part 42 of the mixing channel 40.

In addition, the temperature control apparatus 1 according to this embodiment further comprises a first circulation channel 61 and a second circulation channel 62 that extend and diverge from the temperature adjusting device 50, through which the heating medium going out from the temperature adjusting device 50 passes. The first circulation channel 61 is connected to the first spool valve 100, while the second circulation channel 62 is connected to the second spool valve 200.

The first spool valve 100 has a first outlet port for return 101 from which the heating medium from the first circulation channel 61 goes out, and is configured to adjust a flow rate of the heating medium that passes from the first circulation channel 61 to the first outlet port for return 101 to go out therefrom, according as adjustment of a flow rate of the heating medium passing from the first supply channel 11 to the mixing channel 40. The first spool valve 100 is adapted to return the heating medium going out from the first outlet port for return 101 to the first temperature regulating unit 10. Similarly, the second spool valve 200 has a second outlet port for return 201 from which the heating medium from the second circulation channel 62 goes out, and is configured to adjust a flow rate of the heating medium that passes from the second circulation channel 62 to the second outlet port for return 201 to go out therefrom, according as adjustment of a flow rate of the heating medium passing from the second supply channel 21 to the mixing channel 40. The second spool valve 200 is adapted to return the heating medium going out from the second outlet port for return 201 to the second temperature regulating unit 20. The aforementioned heating medium used in this embodiment is liquid, and the same heating medium is used in the first temperature regulating unit 10 and the second temperature regulating unit 20. Herebelow, structures of the respective units of the temperature control apparatus 1 are described.

<First Temperature Regulating Unit>

As shown in FIG. 1, the first temperature regulating unit 10 includes: the aforementioned first supply channel 11; a first return channel 12 connected to the aforementioned first outlet port for return 101, through which the heating medium going out from the first outlet port for return 101 passes; a first intermediate channel 13 interposed between the first return channel 12 and the first supply channel 11; a first cooling device 14 that cools the heating medium at an upstream portion of the first intermediate channel 13, which is a portion including the first return channel 12 up to an upstream end of the first supply channel 11; and a first heating device 15 that heats the heating medium on the downstream side of a cooled position of the first cooling device 14 in the portion including the first return channel 12 up to the upstream end of the first supply channel 11. In this embodiment, the first return channel 12 and the first intermediate channel 13 are connected by a first side three-way valve 16. The first intermediate channel 13 has a first side main channel part 13M and a first side bypass channel part 13B.

The first side three-way valve 16 is connected, at a first port thereof, to a downstream end of the first return channel 12, is connected, at a second port thereof, to an upstream end of the first side main channel part 13M, and is connected, at a third port thereof, to an upstream end of the first side bypass channel part 13B. The first side three-way valve 16 is configured to supply the heating medium from the first return channel 12 to the first side main channel part 13M and the first side bypass channel part 13B, in such a manner that each flow rate of the heating medium can be adjusted.

The first cooling device 14 is adapted to cool the heating medium passing through the first side main channel part 13M. In the illustrated example, the first cooling device 14 has a cooling-water supply path 14A through which cooling water passes, a cooling device body 14B to which the cooling water is supplied from the cooling-water supply path 14A, and a cooling-water return path 14C through which the cooling water going out from the cooling device body 14B passes. By means of heat exchange between the cooling water passing through the cooling device body 14B and the heating medium passing through the first side main channel part 13M, the first cooling device 14 is adapted to cool the heating medium. Namely, in the illustrated example, a heat exchanger is constituted by the cooling device body 14B and a part of the first side main channel part 13M.

A downstream end of the first side main channel part 13M is connected to the first heating device 15. The first heating device 15 is adapted to receive and heat the heating medium going out from the first side main channel part 13M, and to supply the heating medium to the first supply channel 11. In this embodiment, the aforementioned first side bypass channel part 13B is connected to a position that is on the downstream side of the cooled position of the first cooling device 14 in the first side main channel part 13M and on the upstream side of the connection position to the first heating device 15. Thus, the first heating device 15 can heat the heating medium which is the combination of the heating medium that has been cooled by the first cooling device 14 and the heating medium that has passed through the first side bypass channel part 13B.

The first heating device 15 includes a first side heating-medium tank 15A and a first side heater 15B accommodated in the first side heating-medium tank 15A. Thus, the first heating device 15 combines a heating medium flowing into the first side heating-medium tank 15A with the heating medium already stored therein, and heats the combined heating medium. The first side heating-medium tank 15A forms a closed space. The heating medium therein is stored in the first side heating-medium tank 15A at an amount by which a gas phase is formed between a liquid level thereof and an upper wall part of the first side heating-medium tank 15A.

In FIG. 1, the sign 17 depicts a pump that causes the heating medium to pass through the first supply channel 11, the sign 18A depicts a downstream side temperature sensor that detects a temperature of the heating medium passing through the first supply channel 11 on the downstream side of the pump 17, and the sign 18B depicts a heating control device that electrically connects to the downstream side temperature sensor 18A and electrically connects to the first side heater 15B of the first heating device 15. In addition, the sign 18C depicts an upstream side temperature sensor that detects a temperature of the heating medium passing through a connection position between the first side main channel part 13M and the first side bypass channel part 13B, and the sign 18D depicts a three-way valve control device that electrically connects to the upstream side temperature sensor 18C and electrically connects to the first side three-way valve 16. In addition, the symbol 19A depicts a flow rate sensor that detects a flow rate of the heating medium passing through the first supply channel 11 on the downstream side of the downstream side temperature sensor 18A, and the sign 19B depicts a flow rate control device that electrically connects to the flow rate sensor 19A and electrically connects to the pump 17 through an inverter.

In the first temperature regulating unit 10, the flow rate control device 19B controls driving of the pump 17 depending on a flow rate of the heating medium detected by the flow rate sensor 19A, so that a flow rate of the heating medium passing through the first supply channel 11 is controlled to a predetermined flow rate. In addition, the three-way valve control device 18D controls the first side three-way valve 16 depending on a temperature of the heating medium detected by the upstream side temperature sensor 18C, so that a temperature of the heating medium detected by the upstream side temperature sensor 18C is controlled to a predetermined temperature. In addition, the heating control device 18B controls a heating quantity of the first side heater 15B depending on a temperature of the heating medium detected by the downstream side temperature sensor 18A, so that a temperature of the heating medium detected by the downstream side temperature sensor 18B is controlled to a predetermined temperature.

In the first temperature regulating unit 10, the heating medium is cooled by the first cooling device 14, and is then heated by the heating device 15 so as to be controlled to a predetermined temperature. Thus, even when a temperature of the heating medium returning from the first return channel 12 may largely vary, a temperature of the heating medium passing through the first supply channel 11 is precisely controlled to a predetermined temperature (for example, 100 degrees C., etc.). Moreover, the first side three-way valve 16 can supply the heating medium from the first return channel 12 to the first side main channel part 13M and the first side bypass channel part 13B, in such a manner that each flow rate of the heating medium can be adjusted. Thus, by adjusting a flow rate of the heating medium to be cooled according to need, prompt temperature control can be enabled, as well as energy consumption required for the temperature control can be restrained.

<Second Temperature Regulating Unit>

As shown in FIG. 1, the second temperature regulating unit 20 includes: the aforementioned second supply channel 21; a second return channel 22 connected to the aforementioned second outlet port for return 201, through which the heating medium going out from the second outlet port for return 201 passes; a second intermediate channel 23 interposed between the second return channel 22 and the second supply channel 21; a second cooling device 24 that cools the heating medium at an upstream portion of the second intermediate channel 23, which is a portion including the first return channel 22 up to an upstream end of the second supply channel 21; and a second heating device 25 that heats the heating medium on the downstream side of a cooled position of the second cooling device 24 in the portion including the second return channel 22 up to the upstream end of the second supply channel 21. In this embodiment, the second return channel 22 and the second intermediate channel 23 are connected by a second side three-way valve 26. The second intermediate channel 23 has a second side main channel part 23M and a second side bypass channel part 23B.

The second side three-way valve 26 is connected, at a first port thereof, to a downstream end of the second return channel 22, is connected, at a second port thereof, to an upstream end of the second side main channel part 23M, and is connected, at a third port thereof, to an upstream end of the second side bypass channel part 23B. The second side three-way valve 26 is configured to supply the heating medium from the second return channel 22 to the second side main channel part 23M and the second side bypass channel part 23B, in such a manner that each flow rate of the heating medium can be adjusted.

The second cooling device 24 is adapted to cool the heating medium passing through the second side main channel part 23M. In the illustrated example, the second cooling device 24 has a cooling-water supply path 24A through which cooling water passes, a cooling device body 24B to which the cooling water is supplied from the cooling-water supply path 24A, and a cooling-water return path 24C through which the cooling water going out from the cooling device body 24B passes. By means of heat exchange between the cooling water passing through the cooling device body 24B and the heating medium passing through the second side main channel part 23M, the second cooling device 24 is adapted to cool the heating medium. Namely, in the illustrated example, a heat exchanger is constituted by the cooling device body 24B and a part of the second side main channel part 23M.

A downstream end of the second side main channel part 23M is connected to the second heating device 25. The second heating device 25 is adapted to receive and heat the heating medium going out from the second main channel part 23M, and to supply the heating medium to the second supply channel 21. In this embodiment, the aforementioned second side bypass channel part 23B is connected to a position that is on the downstream side of the cooled position by the second cooling device 24 in the second side main channel part 23M and on the upstream side of the connection position to the second heating device 25. Thus, the second heating device 25 can heat the heating medium which is the combination of the heating medium that has been cooled by the second cooling device 24 and the heating medium that has passed through the second side bypass channel part 23B.

The second heating device 25 includes a second side heating-medium tank 25A and a second side heater 25B accommodated in the second side heating-medium tank 25A. Thus, the second heating device 25 combines a heating medium flowing into the first side heating-medium tank 15A with the heating medium already stored therein, and heats the combined heating medium. The second side heating-medium tank 25A forms a closed space. The heating medium therein is stored in the second side heating-medium tank 25A at an amount by which a gas phase is formed between a liquid level thereof and an upper wall part of the second side heating-medium tank 25A.

In FIG. 1, the sign 27 depicts a pump that causes the heating medium to pass through the second supply channel 21, the sign 28A depicts a downstream side temperature sensor that detects a temperature of the heating medium passing through the second supply channel 21 on the downstream side of the pump 27, and the sign 28B depicts a heating control device that electrically connects to the downstream side temperature sensor 28A and electrically connects to the second side heater 25B of the second heating device 25. In addition, the sign 28C depicts an upstream side temperature sensor that detects a temperature of the heating medium passing through a connection position between the second side main channel part 23M and the second side bypass channel part 23B, and the sign 28D depicts a three-way valve control device that electrically connects to the upstream side temperature sensor 28C and electrically connects to the second side three-way valve 26. In addition, the sign 29A depicts a flow rate sensor that detects a flow rate of the heating medium passing through the second supply channel 21 on the downstream side of the downstream side temperature sensor 28A, and the sign 29B depicts a flow rate control device that electrically connects to the flow rate sensor 29A and electrically connects to the pump 27 through an inverter.

Since the control of a flow rate and a temperature of the heating medium in the second temperature regulating unit 20 is the same as that of the first temperature regulating unit 10, description thereof is omitted. However, note that, in the second temperature regulating unit 20, a temperature of the heating medium passing through the second supply channel 21 is controlled at a predetermined temperature (for example, 120 degrees C., etc.) which is different from the temperature of the heating medium passing through the first supply channel 11 in the first temperature regulating unit 10.

<Valve Unit>

Figure 2:
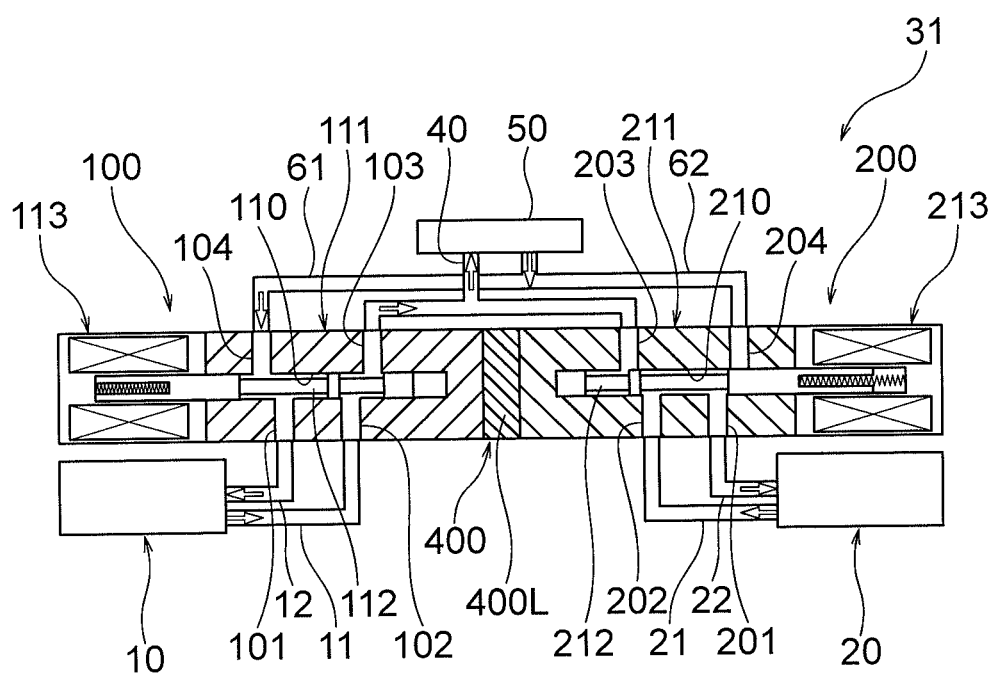
FIG. 2 is a schematic view of a valve unit of the temperature control apparatus shown in FIG. 1.

Next, the valve unit 31 is described. FIG. 2 is a schematic view of the valve unit 31. As shown in FIG. 2, the valve unit 31 in this embodiment includes the aforementioned first spool valve 100, the aforementioned second spool valve 200, and a heat insulting member 400 disposed between the first spool valve 100 and the second spool valve 200. The first spool valve 100 and the second spool valve 200 are coupled through a heat insulating layer 400L formed of the heat insulating member 400.

The first spool valve 100 includes: a first valve body 111 having a spool hole 110 formed therein; a first spool 112 inserted into the spool hole 110 of the first valve body 111; and a first proportional solenoid disposed on one of two ends of the first valve body 111 in an axial direction of the first spool 112, and coupled to the first spool 112. The first spool valve 100 is configured to control a flow rate depending on driving of the first proportional solenoid 113. Similarly, the second spool valve 200 includes: a second valve body 211 having a spool hole 210 formed therein; a second spool 212 inserted into the spool hole 210 of the second valve body 211; and a second proportional solenoid 213 disposed on one of two ends of the second valve body 211 in an axial direction of the second spool 212, and coupled to the second spool 212. The second spool valve 200 is configured to control a flow rate depending on driving of the second proportional solenoid 213. In more detail, the first spool valve 100 and the second spool valve 200 are located such that the first spool 112 and the second spool 212 are coaxial, and are coupled such that the heat insulating member 400, i.e., the heat insulating layer 400L is disposed between the end of the first valve body 111 opposed to the first proportional solenoid 113 and the end of the second valve body 211 opposed to the second proportional solenoid 213, with the ends being facing each other.

The heat insulating member 400 forming the heat insulating layer 400L is provided for restraining thermal effect from one of the first spool valve 100 and the second spool valve 200 to the other. In this embodiment, an closed-cell heat insulating member made of EPDM (ethylene propylene diene rubber) is used as the heat insulating member 400, and the heat insulating member 400 itself forms the heat insulting layer 400L. In this embodiment, the heat insulating member 400 couples the first spool valve 100 and the second spool valve 200 by adhesion, for example. However, by using another tool or the like, the first spool valve 100 and the second spool valve 200 may be coupled with the heat insulating member 400 being sandwiched therebetween. As long as the heat insulating member 400 can restrain the thermal effect, the heat insulating member 400 is not limited to the above. For example, as the heat insulating member 400, there may be used a box-shaped member having therein a space functioning as a heat insulating layer, and coupling the first spool valve 100 and the second spool valve 200. Alternatively, as the heat insulating member 400, there may be used a cylindrically shaped member having one end that fixes the first spool valve 100 and the other end that fixes the second spool valve 200. When the heat insulating member 400 is formed of such a cylindrical member, the cylindrical member fixes the first spool valve 100 and the second spool valve 200 such that a heat insulating layer is formed between the first spool valve 100 and the second spool valve 200. Alternatively, an open-cell bubble heat insulating member may be used as the heat insulating member 400. However, when the heat insulating member 400 is a closed-cell heat insulating member, a liquid tightness and an air tightness can be enhanced, whereby the thermal effect can be effectively restrained.

The aforementioned first proportional solenoid 113 and the second proportional solenoid 213 are electrically connected to the valve control device 80 shown in FIG. 1. The valve control device 80 controls operations of the first spool 112 and the second spool 212 by supplying electricity (current) to the first proportional solenoid 113 and the second proportional solenoid 213. Namely, the first proportional solenoid 113 and the second proportional solenoid 213 respectively adjust positions of the first spool 112 and the second spool 212, depending on values of electricity supplied from the valve control device 80. Thus, the first spool valve 100 can adjust a flow rate depending on the drive of the first proportional solenoid 113, and the second spool valve 200 can adjust a flow rate depending on the drive of the second proportional solenoid 213. The first proportional solenoid 113 and the second proportional solenoid 213 may be adapted to adjust these positions depending on values of voltages applied thereto.

The respective spool valves 100 and 200 are described in detail below. As shown in FIG. 2, the first spool valve 100 in this embodiment includes the aforementioned first outlet port for return 101, a first inlet port for supply 102 connecting to the first supply channel 11, a first outlet port for supply 103 connecting to the mixing channel 40 (first channel part 41), and a first inlet port for return 104 connecting to the first circulation channel 61. The respective ports 101 to 104 extend from an outer surface of the first valve body 111 to the inside thereof to open to the spool hole 110.

The first spool valve 100 is configured to adjust a flow rate of the heating medium passing from the first supply channel 11 to the mixing channel 40 by adjusting, by means of the movement of the first spool 112, a connection between the first inlet port for supply 102 and the first outlet port for supply 103 at an opening degree between a full open condition and a full close condition, and is configured to adjust a flow rate of the heating medium passing from the first circulation channel 61 to the first outlet port for return 101 to go out therefrom by adjusting, by means of the movement of the first spool 112, a connection between the first inlet port for return 104 and the first outlet port for return 101 at an opening degree between a full open condition and a full close condition. The first spool valve 100 in this embodiment is configured such that the opening degree in the connection between the first inlet port for return 104 and the first outlet port for return 101 increases, as the opening degree in the connection between the first inlet port for supply 102 and the first outlet port for supply 103 increases.

Figure 3A:
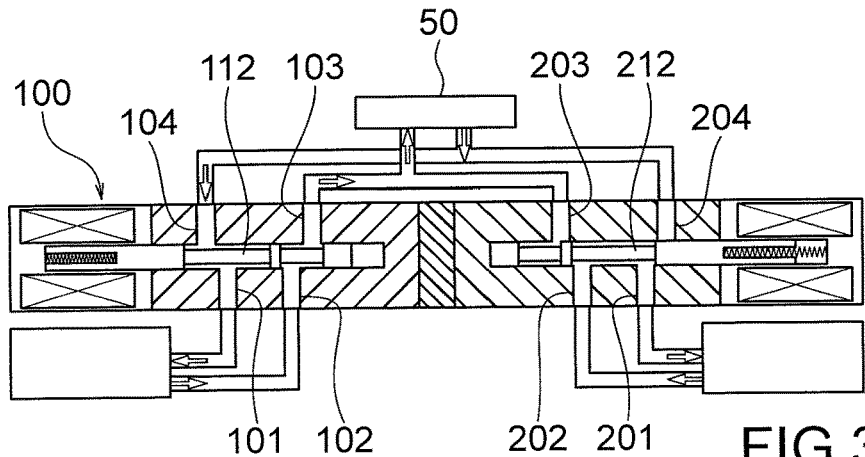
FIG. 3A is a view for explaining an operation of the temperature control apparatus shown in FIG. 1.
Figure 3B:
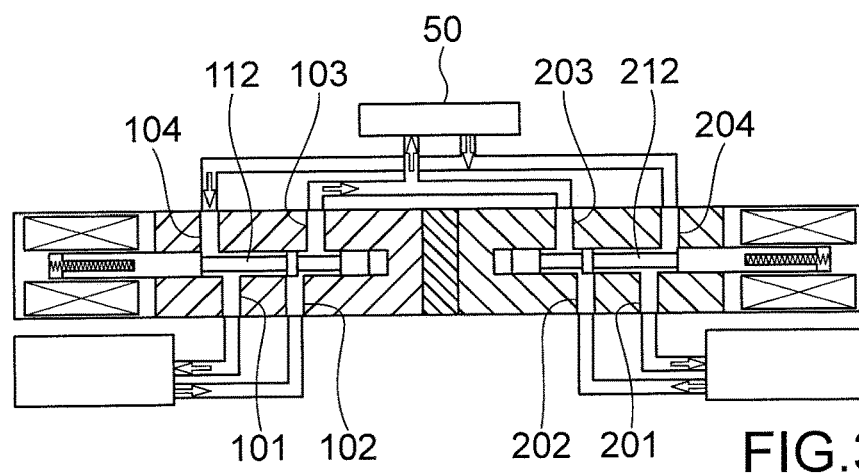
FIG. 3B is a view for explaining the operation of the temperature control apparatus shown in FIG. 1.
Figure 3C:
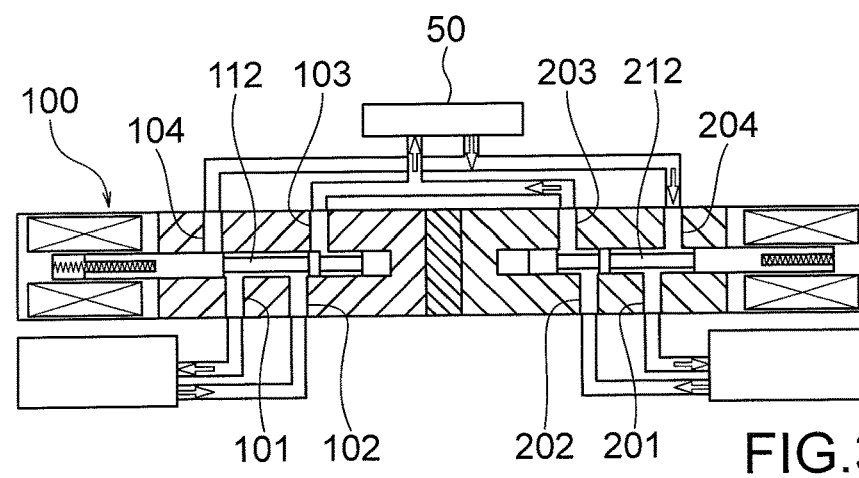
FIG. 3C is a view for explaining the operation of the temperature control apparatus shown in FIG. 1.

This operation is described with reference to FIGS. 3A to 3C. FIG. 3A shows a condition in which the connection between the first inlet port for supply 102 and the first outlet port for supply 103 is in the full open condition, and the connection between the first inlet port for return 104 and the first outlet port for return 101 is in the full open condition. FIG. 3B shows a condition in which the connection between the first inlet port for supply 102 and the first outlet port for supply 103 is at an intermediate value between the full open condition and the full close condition, and the connection between the first inlet port for return 104 and the first outlet port for return 101 is at an intermediate value between the full open condition and the full close condition. FIG. 3C shows a condition in which the connection between the first inlet port for supply 102 and the first outlet port for supply 103 is in the full close condition, and the connection between the first inlet port for return 104 and the first outlet port for return 101 is in the full close condition. In the transition from FIG. 3A, FIG. 3B to FIG. 3C in this order, the first spool 112 moves forward from the left side to the right side in the drawings. As shown in FIGS. 3A to 3C, in this embodiment, as the opening degree in the connection between the first inlet port for supply 102 and the first outlet port for supply 103 increases, the opening degree in the connection between the first inlet port for return 104 and the first outlet port for return 101 increases. In addition, in this embodiment, when the opening degree in the connection between the first inlet port for supply 102 and the first outlet port for supply 103 is in the full open condition, the opening degree in the connection between the first inlet port for return 104 and the first outlet port for return 101 is in the full open condition. When the opening degree in the connection between the first inlet port for supply 102 and the first outlet port for supply 103 is in the full close condition, the opening degree in the connection between the first inlet port for return 104 and the first outlet port for return 101 is in the full close condition.

In addition, as shown in FIG. 3C, the first spool valve 100 in this embodiment is configured to connect the first inlet port for supply 102 and the first outlet port for return 101 in a full open condition, when the connection between the first inlet port for supply 102 and the first outlet port for supply 103 is in the full close condition, and the connection between the first inlet port for return 104 and the first outlet port for return 101 is in the full close condition. As apparent from FIG. 3C, FIG. 3B and FIG. 3A seen in this order, the connection between the first inlet port for supply 102 and the first outlet port for return 101 comes close to a full close condition, as the connection between the first inlet port for supply 102 and the first outlet port for supply 103 and the connection between the first inlet port for return 104 and the first outlet port for return 101 come close to the full open condition. When the connection between the first inlet port for supply 102 and the first outlet port for supply 103 reaches the full open condition and the connection between the first inlet port for return 104 and the first outlet port for return 101 reaches the full open condition, the connection between the first inlet port for supply 102 and the first outlet port for return 101 is fully closed (see FIG. 3A).

On the other hand, as shown in FIG. 2, the second spool valve 200 includes the aforementioned second outlet port for return 201, a second inlet port for supply 202 connecting to the second supply channel 21, a second outlet port for supply 203 connecting to the mixing channel 40 (second channel part 42), and a second inlet port for return 204 connecting to the second circulation channel 62. The respective ports 201 to 204 extend from an outer surface of the second valve body 211 to the inside thereof to open to the spool hole 210.

The second spool valve 200 is also configured to adjust a flow rate of the heating medium passing from the second supply channel 21 to the mixing channel 40 by adjusting, by means of the movement of the second spool 212, a connection between the second inlet port for supply 202 and the second outlet port 203 for supply 203 at an opening degree between a full open condition and a full-close condition, and is configured to adjust a flow rate of the heating medium passing from the second circulation channel 62 to the second outlet port for return 201 to go out therefrom by adjusting, by means of the movement of the second spool 212, a connection between the second inlet port for return 204 and the second outlet port for return 201 at an opening degree between a full open condition and a full close condition. The second spool valve 200 is also configured such that the opening degree in the connection between the second inlet port for return 204 and the second outlet port for return 201 increases, as the opening degree in the connection between the second inlet port for supply 202 and the second outlet port for supply 203 increases.

Namely, FIG. 3A shows a condition in which the connection between the second inlet port for supply 202 and the second outlet port for supply 203 is in the full close condition, and the connection between the second inlet port for return 204 and the second outlet port for return 201 is in the full close condition. FIG. 3B shows a condition in which the connection between the second inlet port for supply 202 and the second outlet port for supply 203 is at an intermediate value between the full open condition and the full close condition, and the connection between the second inlet port for return 204 and the second outlet port for return 201 is at an intermediate value between the full open condition and the full close condition. FIG. 3C shows a condition in which the connection between the second inlet port for supply 202 and the second outlet port for supply 203 is in the full open condition, and the connection between the second inlet port for return 204 and the second outlet port for return 201 is in the full open condition. In the transition from FIG. 3A, FIG. 3B to FIG. 3C in this order, the second spool 212 moves rearward from the left side to the right side in the drawings. As shown in FIGS. 3A to 3C, in this embodiment, as the opening degree in the connection between the second inlet port for supply 202 and the second outlet port for supply 203 increases, the opening degree in the connection between the second inlet port for return 204 and the second outlet port for return 201 increases. In addition, in this embodiment, when the opening degree in the connection between the second inlet port for supply 202 and the second outlet port for supply 203 is in the full open condition, the opening degree in the connection between the second inlet port for return 204 and the second outlet port for return 201 is in the full open condition. When the opening degree in the connection between the second inlet port for supply 202 and the second outlet port for supply 203 is in the full close condition, the opening degree in the connection between the second inlet port for return 204 and the second outlet port for return 201 is in the full close condition.

In addition, as shown in FIG. 3A, the second spool valve 200 in this embodiment is configured to connect the second inlet port for supply 202 and the second outlet port for return 201 in a full open condition, when the connection between the second inlet port for supply 202 and the second outlet port for supply 203 is in the full close condition, and the connection between the second inlet port for return 204 and the second outlet port for return 201 is in the full closed condition. As apparent from FIGS. 3A, 3B and 3C seen in this order, the connection between the second inlet port for supply 202 and the second outlet port for return 201 comes close to a full close condition, as the connection between the second inlet port for supply 202 and the second outlet port for supply 203 and the connection between the second inlet port for return 204 and the second outlet port for return 201 come close to the full open condition. When the connection between the second inlet port for supply 202 and the second outlet port for supply 203 reaches the full open condition, and the connection between the second inlet port for return 204 and the second outlet port for return 201 reaches the full open condition, the connection between the second inlet port for supply 202 and the second outlet port for return 201 is fully closed (see FIG. 3C).

In addition, in this embodiment, as shown in FIG. 3A, for example, when the connection between the first inlet port for supply 102 and the first outlet port for supply 103 is in the full open condition, and the connection between the first inlet port for return 104 and the first outlet port for return 101 is in the full open condition, the connection between the second inlet port for supply 202 and the second outlet port for supply 203 is in the full close condition, and the connection between the second inlet port for return 204 and the second outlet port for return 201 is in the full close condition. On the other hand, as shown in FIG. 3C, when the connection between the first inlet port for supply 102 and the first outlet port for supply 103 is in the full close condition, and the connection between the first inlet port for return 104 and the first outlet port for return 101 is in the full close condition, the connection between the second inlet port for supply 202 and the second outlet port for supply 203 is in the full open condition, and the connection between the second inlet port for return 204 and the second outlet port for return 201 is in the full open condition. The first spool valve 100 and the second spool valve 200 have the same structure with other (dimensions and so on of the respective constituent elements are identical).

Thus, in this embodiment, a flow rate of the heating medium supplied from the valve unit 31 to the mixing channel 40 are configured to be basically constant, whereby the temperature control stability in the temperature adjusting device 50 is improved. In order to achieve this, when the aforementioned valve control device 80 controls an opening degree in the connection between the first inlet port for supply 102 and the first outlet port for supply 103 of the first spool valve 100 at A % that is between 0% and 100%, the valve control device 80 is adapted to control an opening degree in the connection between the second inlet port for supply 202 and the second outlet port for supply 203 of the second spool valve 200 at (100−A) %. Due to such a control, a flow rate of the heating medium supplied from the valve unit 31 to the mixing channel 40 can be basically made constant, whereby the temperature control stability in the temperature adjusting device 50 can be improved. In addition, since this control can be carried out by controlling the second spool valve 200 reversely to and synchronically with the control of the first spool valve 100, the temperature control stability in the temperature adjusting device 50 can be improved by an easy operation.

The valve control device 80 can control the second spool valve 200 reversely to and synchronically with the control of the first spool valve 100, as described above, but the valve control device 80 can control the first spool valve 100 and the second spool valve 200 separately.

In the temperature control apparatus 1 according to the embodiment as described above, the heating medium passing through the first supply channel 11, with its temperature being controlled by the first temperature regulating unit 10 at a predetermined temperature, and the heating medium passing through the second supply channel 21, with its temperature being controlled by the second temperature regulating unit 20 at a temperature that is different from that of the heating medium in the first supply channel 11 can be caused to flow into the temperature adjusting device 50 through the mixing channel 40, while flow rates of these heating media are controlled by the valve unit 31. Therefore, a temperature of the temperature adjusting device 50 can be controlled at a desired temperature that is between the temperature of the heating medium passing through the first supply channel 11 and the temperature of the heating medium passing through the second supply channel 21. At this time, since the temperature of the temperature adjusting device 50 is controlled by combining the heating media of different temperatures, the temperature of the temperature adjusting device 50 can be promptly controlled to a desired temperature. In addition, since the valve unit 31 controls the flow rates of the heating media by means of the linear movements of the first spool valve 100 and the second spool valve 200, the flow rates of the heating media are promptly controlled to desired flow rates, whereby the temperature of the temperature adjusting device 50 can be promptly controlled to a predetermined temperature. Thus, for example, it is possible to promptly control, through the temperature adjusting device 50, a temperature of a substrate, which is held on a substrate holding unit of a plasma treatment apparatus, to a predetermined temperature.

In the temperature control apparatus 1 according to this embodiment, since the first spool valve 100 and the second spool valve 200 are coupled through the heat insulating layer 400L in the valve unit 31, the first spool valve 100 and the second spool valve 200 are made as a unit. Thus, although a plurality of channels are connected to the first spool valve 100 and the second spool valve 200 and it is necessary to perform a flow rate control in these channels, complication and enlargement of the temperature control apparatus 1 as a whole can be restrained. In particular, in this embodiment, the first spool valve 100 and the second spool valve 200 are coupled in such a manner that the first spool 112 and the second spool 212 are coaxial, and that the heat insulating layer 400L is disposed between the end of the first valve body 111 and the end of the second valve body 211, with the ends facing each other. Thus, radial extension with respect to a spool axis can be restrained, whereby enlargement of the temperature control apparatus 1 as a whole can be effectively restrained. Since the first spool valve 100 and the second spool valve 200 are coupled through the heat insulation layer 400L, the thermal effect from one to the other can be restrained. Thus, it can be restrained that a temperature of the heating medium supplied to the temperature adjusting device 50 through the mixing channel 40 undesirably varies.

Thus, even when it is necessary to perform control by means of valves in a plurality of channels, complication and enlargement of the apparatus as a whole can be restrained, as well as a temperature of an area to be temperature-controlled controlled by the temperature adjusting device 50, for example, the aforementioned substrate holding unit or the substrate can be promptly and precisely controlled to a desired temperature. In particular, when there are plurality of areas to be temperature-controlled, the temperature control apparatus 1 according to this embodiment is connected to each of the areas to be temperature-controlled for temperature control. In this case, the valve unit 31 according to this embodiment can significantly beneficially restrain complication and enlargement of the apparatus as a whole.

In addition, the temperature control apparatus 1 according to this embodiment further includes the first circulation channel 61 and the second circulation channel 62 that extend and diverge from the temperature adjusting device 50, through which the heating medium going out from the temperature adjusting device 50 passes. The first spool valve 100 is connected to the first circulation channel 61, while the second spool valve 200 is connected to the second circulation channel 62. The first spool valve 100 includes the first outlet port for return 101 from which the heating medium from the first circulation channel 61 goes out, and is configured to adjust a flow rate of the heating medium passing from the first circulation channel 61 to the first outlet port for return 101 to go out therefrom, according as adjustment of a flow rate of the heating medium passing from the first supply channel 11 to the mixing channel 40. The second spool valve 200 has the same structure. Thus, since the first spool valve 100 and the second spool valve 200, which are made as a unit, can control a flow rate of the heating medium returning from the temperature adjusting device 50, complication and enlargement of the apparatus as a whole, can be significantly beneficially restrained.

In addition, in this embodiment, the first spool valve 100 adjusts the connection between the first inlet port for supply 102 and the first outlet port for supply 103 at an opening degree between the full open condition and the full close condition so as to adjust a flow rate of the heating medium passing from the first supply channel 11 to the mixing channel 40, and adjusts the connection between the first inlet port for return 104 and the first outlet port for return 101 at an opening degree between the full open condition and the full close condition so as to adjust a flow rate of the heating medium passing from the first circulation channel 61 to the first outlet port for return 101 to go out therefrom. As the opening degree in the connection between the first inlet port for supply 102 and the first outlet port for supply 103 increases, the opening degree in the connection between the first inlet port for return 104 and the first outlet port for return 101 increases.

Thus, depending on an amount of the heating medium supplied from the first supply channel 11 to the temperature adjusting device 50, the heating medium can be returned, through the temperature adjusting device 50, to the temperature regulating unit 10, whereby variations of a flow rate and a pressure of the heating medium can be restrained in the first temperature regulating unit 10. Thus, the first temperature regulating unit 10 can be stably operated. This holds true with the second temperature regulating unit 20. As a result, a temperature of the heating medium can be stabilized, and follow-up responsibility to a desired temperature of the area to be temperature-controlled controlled by the temperature adjusting device 50 and control precision thereof can be improved.

In addition, in this embodiment, when the connection between the first inlet port for supply 102 and the first outlet port for supply 103 is in the full close condition and the connection between the first inlet port for return 104 and the first outlet port for return 101 is in the full close condition, the first inlet port for supply 102 and the first outlet port for return 101 are connected in the full open condition. In addition, the connection between the first inlet port for supply 102 and the first outlet port for return 101 comes close to the full close condition, as the connection between the first inlet port for supply 102 and the first outlet port for supply 103 and the connection between the first inlet port for return 104 and the first outlet port for return 101 come close to the full open condition. When the connection between the first inlet port for supply 102 and the first outlet port for supply 103 reaches the full open condition and the connection between the first inlet port for return 104 and the first outlet port for return 101 reaches the full open condition, the connection between the first inlet port for supply 102 and the first outlet port for return 101 reaches the full close condition.

Therefore, even when the opening degree of the connection between the first inlet port for supply 102 and the first outlet port for supply 103 and the opening degree of the connection between the first inlet port for return 104 and the first outlet port for return 101 are changed, pressure variation of the heating medium passing through the respective channels and the first spool valve 100 can be stably restrained. Thus, the first temperature regulating unit 1 can be operated in a significantly stable condition. This holds true with the second temperature regulating unit. As a result, a temperature of the heating medium can be stabilized, and follow-up responsibility to a desired temperature of the area to be temperature-controlled controlled by the temperature adjusting device 50 and control precision thereof can be improved.

Second Embodiment

Figure 4:
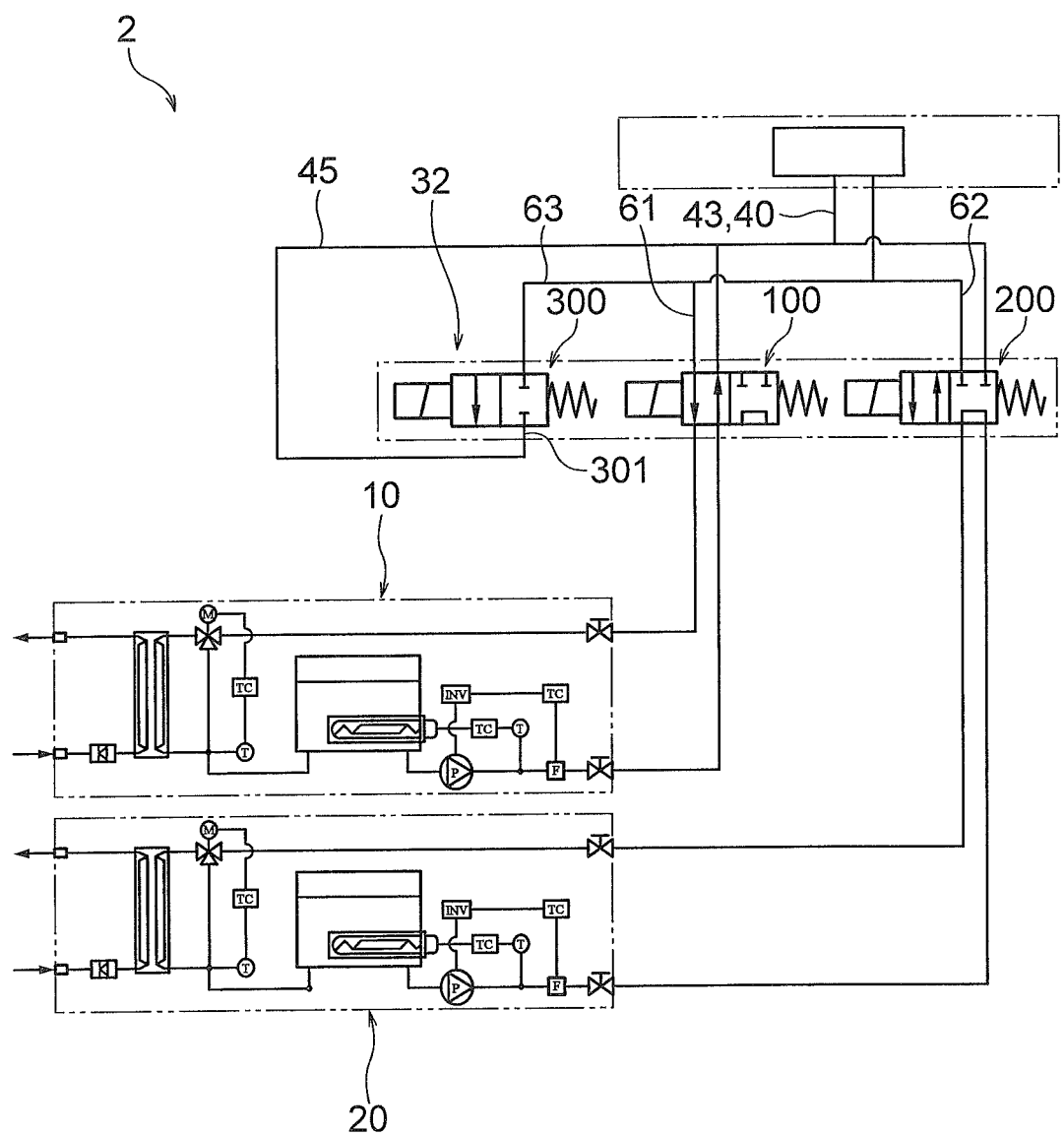
FIG. 4 is a schematic view of a temperature control apparatus according to a second embodiment of the present invention.
Figure 5:
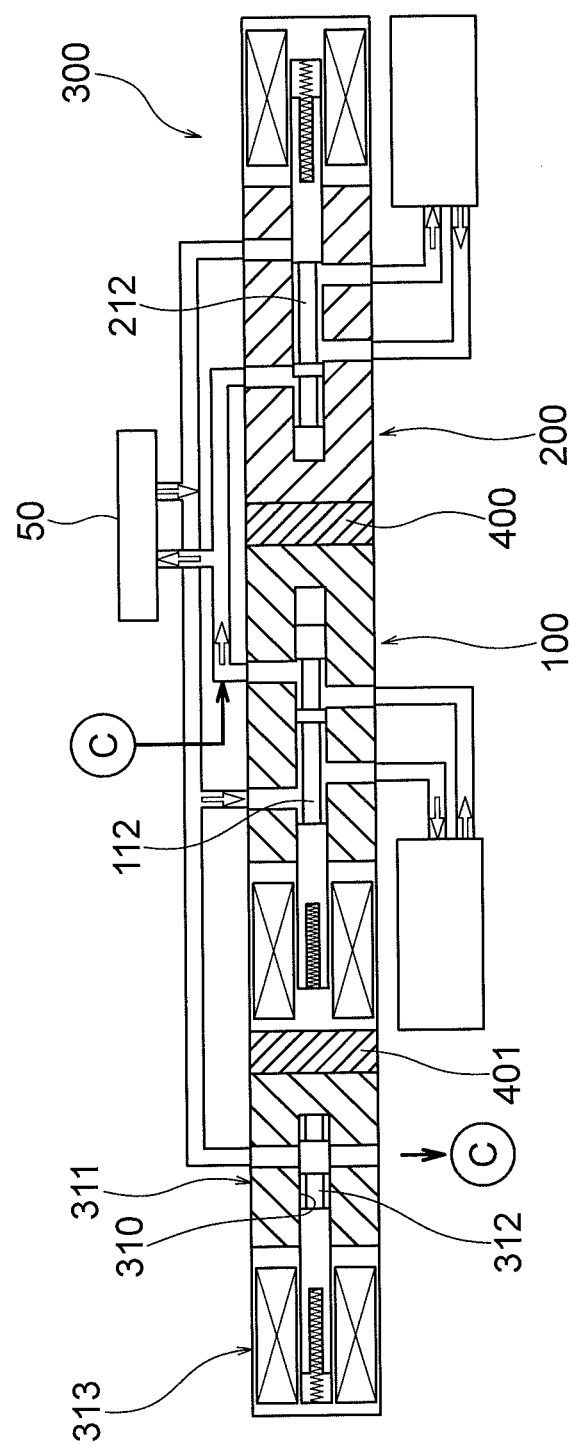
FIG. 5 is a schematic view of a valve unit of the temperature control apparatus shown in FIG. 4.

Next, a temperature control apparatus 2 according to a second embodiment of the present invention will be described with reference to FIGS. 4 and 5. FIG. 4 is a schematic view of the temperature control apparatus 2 according to the second embodiment, and FIG. 5 is a schematic view of a valve unit 32 of the temperature control apparatus 2. The same constituent elements in this embodiment as those of the first embodiment are indicated by the same signs and their description is omitted.

As shown in FIG. 4, the temperature control apparatus 2 according to this embodiment further includes, in addition to a first circulation channel 61 and a second circulation channel 62, a third circulation channel 63 which extends and diverges from a temperature adjusting device 50, through which a heating medium going out from the temperature adjusting device 50 passes. On the other hand, a valve unit 32 includes a third spool valve 300 connected to the third circulation channel 63.

The third spool valve 300 has a third outlet port for return 301 through which the heating medium from the third circulation channel 63 goes out, and is configured to switch passage and blockage of the heating medium from the third circulation channel 63 to the third outlet port for return 301, in such a manner that a flow rate of the heating medium can be adjusted. Alternatively, the third spool valve 300 may be configured to merely switch passage and blockage of the heating medium from the third circulation channel 63 to the third outlet port for return 301. In addition, in this embodiment, a mixing channel 40 further includes a third channel part 45, and the third outlet port for return 301 is connected to a mixing unit body 43 of the mixing channel 40 through the third channel part 45.

As shown in FIG. 5, the third spool valve 300 includes: a third valve body 311 having a spool hole 310 formed therein; a third spool 312 inserted into the spool hole 310 of the third valve body 311; and a third proportional solenoid 313 disposed on one of two ends of the third valve body 311 in an axial direction of the third spool 312, and coupled to the third spool 312. The end of the third valve body 311, which is located on the opposite side of the side of the third proportional solenoid 313 in the third spool valve 300, is coupled to a first spool valve 100 through a heat insulating member 401 forming a heat insulating layer. The third spool 312 is located coaxially with a first spool 112 and a second spool 212. The third spool valve 300 may be coupled to the first spool valve 100 or the second spool valve 200, without the heat insulating member 404 therebetween.

In the temperature control apparatus 2 according to this second embodiment, as shown by the sign "C" in FIG. 5, the heating medium going out from the temperature adjusting device 50 can be returned to the temperature adjusting device 50 by the third spool valve 300, in such a manner that a flow rate of the heating medium can be adjusted. Thus, when it is not necessary that the temperature adjusting device 50 is precisely controlled or when a temperature of the temperature adjusting device 50 does not so largely vary, for example, the heating medium going out from the temperature adjusting device 50 can be returned to the temperature adjusting device 50 without temperature-controlling the heating medium. Thus, energy consumption for controlling temperatures of the heating media in the first temperature regulating unit 10 and the second temperature regulating unit 20 can be restrained.

Third Embodiment

Figure 6:
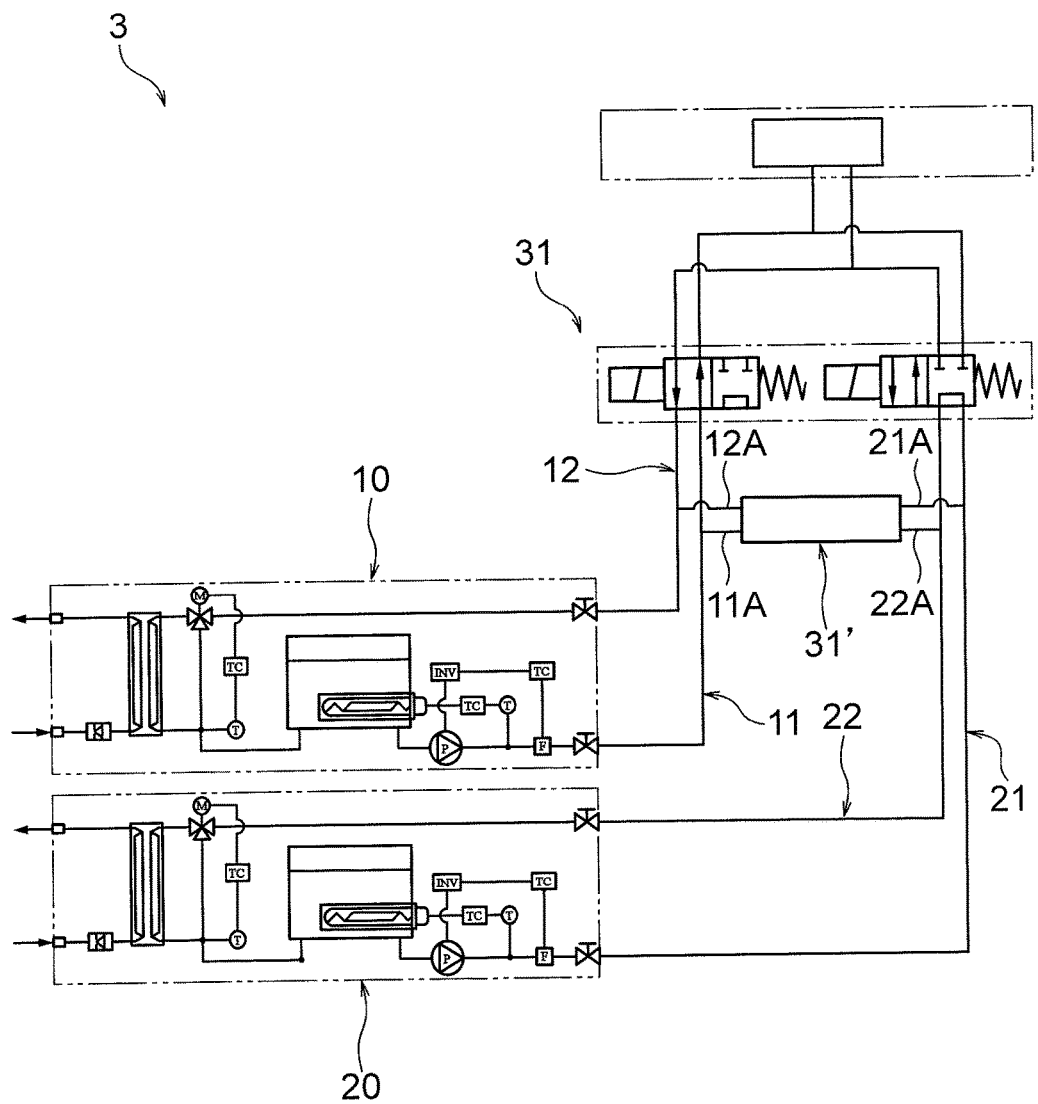
FIG. 6 is a schematic view of a temperature control apparatus according to a third embodiment of the present invention.

Next, a temperature control apparatus 3 according to a third embodiment is described with reference to FIG. 6. FIG. 6 is a schematic view of the temperature control apparatus 3 according to the third embodiment. The same constituent elements in this embodiment as those of the first embodiment are indicated by the same signs and their description is omitted.

As shown in FIG. 6, in the temperature control apparatus 3 according to this embodiment, one or more (one in this example) supply diverging channel 11A diverges from a first supply channel 11 of a first temperature regulating unit 10, and one or more (one in this example) return diverging channel 12A diverges from a first return channel 12 thereof. In addition, one or more (one in this example) supply diverging channel 21A diverges from a second supply channel 21 of a second temperature regulating unit 20, and one or more (one in this example) return diverging channel 22A diverges from a second return channel 22 thereof. A valve unit 31° similar to the valve unit 31 is connected to the first return channel 12, the return diverging channel 12A, the supply diverging channel 21A and the return diverging channel 22A.

In the third temperature control apparatus 3 according to the third embodiment, since flow rates of heating media from the first temperature regulating unit 10 and the second temperature regulating unit 20 are controlled by a plurality of the valve units, a plurality of areas to be temperature-controlled can be temperature-controlled.

Fourth Embodiment

Figure 7:
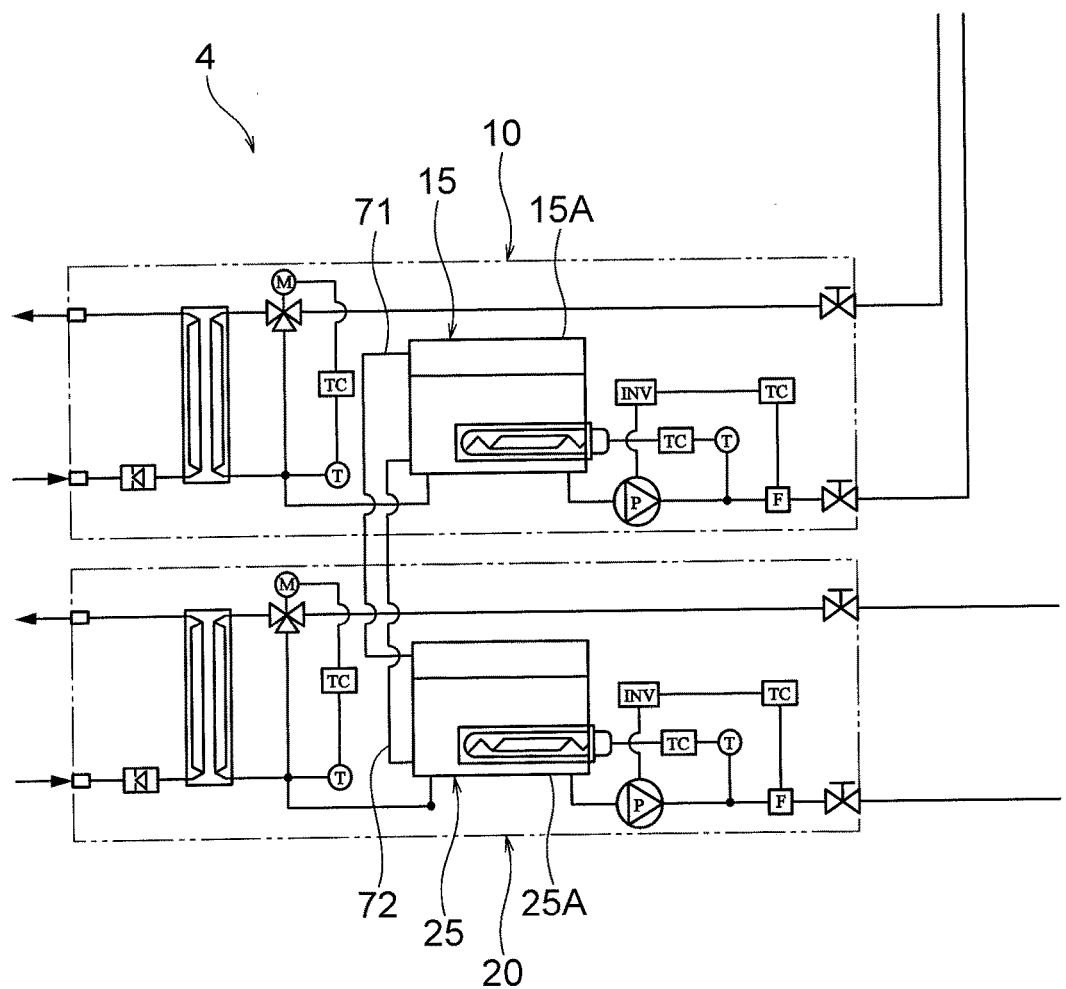
FIG. 7 is a schematic view of a temperature control apparatus according to a fourth embodiment of the present invention.

Next, a temperature control apparatus 4 according to a fourth embodiment of the present invention is described with reference to FIG. 7. FIG. 7 is a schematic view of the temperature control apparatus 4 according to the fourth embodiment, showing, in particular, showing a first temperature regulating unit 10 and a second temperature regulating unit. This embodiment differs from the first embodiment in structures of the first temperature regulating unit 10 and the second temperature regulating unit 20. The same constituent elements in this embodiment as those of the first embodiment are indicated by the same signs and their description is omitted.

As shown in FIG. 7, in the temperature control apparatus 4 according to this embodiment, a first side heating-medium tank 15A of a first heating device 15 in the first temperature regulating unit 10 and a second side heating-medium tank 25A of a second heating device 25 in the second temperature regulating unit 20 are connected by a first connection pipe 71 and a second connection pipe 72.

The first connection pipe 71 connects an upper part of the first side heating-medium tank 15A and an upper part of the second side heating-medium tank 25A. The first connection pipe 71 is provided for fluidly connecting respective gas layers of the first side heating-medium tank 15A and the second side heating-medium tank 25A each storing a heating medium. The second connection pipe 72 connects a lower part of the first side heating-medium tank 15A and a lower part of the second side heating-medium tank 25A. The second connection pipe 72 is provided for fluidly connecting liquid layers of the respective heating media of the first side heating-medium tank 15A and the second side heating-medium tank 25A.

In more detail, a reference liquid level height for storing a heating medium is set for each of the first side heating-medium tank 15A and the second side heating-medium tank 25A. The first connection pipe 71 connects a part of the first side heating-medium tank 15A, the part being above the reference liquid level height, and a part of the second side heating-medium tank 25A, the part being above the reference liquid level height. On the other hand, the second connection pipe 72 connects a part of the first side heating-medium tank 15A, the part being below the reference liquid level height, and a part of the second side heating-medium tank 25A, the part being below the reference liquid level height.

According to the temperature control apparatus 4 according to the fourth embodiment, the gas in the gas layer and the heating medium are allowed to move between the first side heating-medium tank 15A and the second side heating-medium tank 25A, depending on the pressure variation. Thus, a liquid level of the heating medium in the first side heating-medium tank 15A and a liquid level of the heating medium in the second side heating-medium tank 25A can be uniformly kept. As a result, the pressure variations in the first temperature regulating unit 10 and the second temperature regulating unit 20 are retrained and temperatures of the heating media are stabilized, whereby follow-up responsibility to a desired temperature of the area to be temperature-controlled controlled by the temperature adjusting device 50 and control precision thereof can be improved.

Fifth Embodiment

A temperature control apparatus according to a fifth embodiment of the present invention is described. In the above-described first embodiment, the first spool valve 100 has the first proportional solenoid valve 113 and the second spool valve 200 has the second proportional solenoid valve 213, by way of example. On the other hand, in this embodiment, a first spool valve 100 has an electromagnetic solenoid and a second spool valve 200 has an electromagnetic solenoid valve. Thus, operations of the first spool valve 100 and the second spool valve 200 differ from those of the first embodiment. The constituent elements of the first spool valve 100 and the second spool valve 200 in this embodiment are the same as those of the first embodiment, except the solenoids. Thus, this embodiment is described below with reference to FIGS. 1 and 2, with using the signs in FIGS. 1 and 2.

The respective electromagnetic solenoids of the first spool valve 100 and the second spool valve 200 used in this embodiment are general electromagnetic solenoids in which two positions are switched, depending on an excitation condition and a non-excitation condition. The first spool valve 100 is configured to switch passage and blockage of a heating medium depending on a position of the electromagnetic solenoid. In more detail, the first spool valve 100 is configured to switch passage and blockage of the heating medium from the first circulation channel 61 to the first outlet port for return 101, according as switching between passage and blockage of the heating medium from the first supply channel 11 to the mixing channel 40.

In addition, as shown in FIG. 2, the first spool valve 100 is configured to cause the heating medium to pass from the first circulation channel 61 to the first outlet port for return 101, when the first spool valve 100 causes the heating medium to pass from the first supply channel 11 to the mixing channel 40, as well as the first spool valve 100 blocks the heating medium from the first circulation channel 61 to the first outlet port for return 101, when the first spool valve 100 blocks the heating medium from the first supply channel 11 to the mixing channel 40. Further, the first spool valve 100 is configured to connect the first inlet port for supply 102 and the first outlet port for return 101, when the first spool valve 100 blocks the first inlet port for supply 102 and the first outlet port for supply 103 so as to block the heating medium from the first supply channel 11 to the mixing channel 40, and blocks the first inlet port for return 104 and the first outlet port for return 101 so as to block the heating medium from the first circulation channel 61 to the first outlet port for return 101. The second spool valve 200 has the same structure as that of the first spool valve 100.

In this embodiment, when the valve control device 80 controls the first spool valve 100 such that the heating medium passes from the first supply channel 11 to the mixing channel 40, the valve control device 80 is configured to control the second spool valve 200 such that the heating medium from the second supply channel 21 to the mixing channel 40 is blocked. In addition, when the valve control device 80 controls the second spool valve 200 such that the heating medium passes from the second supply channel 21 to the mixing channel 40, the valve control device 80 is configured to control the first spool valve such that the heating medium from the first supply channel 11 to the mixing channel 40 is blocked. In order to carry out such a control, when the valve control device 80 in this embodiment controls the electromagnetic solenoid of the first spool valve 100 so as to be in one of the excitation condition and the non-excitation condition, the valve control device 80 controls the electromagnetic solenoid of the second spool valve 200 so as to be in the other one of the excitation condition and the non-excitation condition.

Also according to such a fifth embodiment, even when it is necessary to perform control by means of valves in a plurality of channels, complication and enlargement of the apparatus as a whole can be restrained, as well as a temperature of an area to be temperature-controlled controlled by the temperature adjusting device 50 can be promptly controlled to a desired temperature. Since the heating media of different temperatures can be quickly switched and supplied to the temperature adjusting device 50, this embodiment can be beneficially used when a prompt temperature switching is required.

Although the respective embodiments have been described above, the present invention is not limited to the above-described embodiments. For example, the first temperature regulating unit 10 and the second temperature regulating unit 20 are not limited to the illustrated examples, and the bypass channel parts 13B and 23B may be omitted, for example. In addition, the first connection pipe 71 and the second connection pipe 72 in the above-described fourth embodiment may be applied to the second, third or fifth embodiment.

DESCRIPTION OF SIGNS 1, 2, 3, 4 Temperature control apparatus
10 First temperature regulating unit
11 First supply channel
12 First return channel
13 First intermediate channel
14 First cooling device
15 First heating device
16 First side three-way valve
20 Second temperature regulating unit
21 Second supply channel
22 Second return channel
23 Second intermediate channel
24 Second cooling device
25 Second heating device
26 Second side three-way valve
31, 32 Valve unit
40 Mixing channel
50 Temperature adjusting device
61 First circulation channel
62 Second circulation channel
63 Third circulation channel
80 Valve control device
100 First spool valve
101 First outlet port for return
102 First inlet port for supply
103 First outlet port for supply
104 First inlet port for return
110 Spool hole
111 First valve body
112 First spool
113 First proportional solenoid
200 Second spool valve
201 Second outlet port for return
202 Second inlet port for supply
203 Second outlet port for supply
204 Second inlet port for return
210 Spool hole
211 Second valve body
212 Second spool
213 Second proportional solenoid
300 Third spool valve
301 Third outlet port for return
400, 401 Heat insulating member
400L Heat insulating layer

What is claimed is:

1. A temperature control apparatus comprising:
a first temperature regulating unit including a first supply channel through which a heating medium passes;
a second temperature regulating unit including a second supply channel through which a heating medium passes, the heating medium being controlled at a temperature different from that of the heating medium passing through the first supply channel;
a valve unit connected to the first supply channel and the second supply channel;
a mixing channel connected to the valve unit, the mixing channel including a mixing unit body through which at least one of the heating medium passing through the first supply channel to go out from the valve unit, and the heating medium passing through the second supply channel to go out from the valve unit, passes; and
a temperature adjusting device in which the heating medium going out from the mixing channel passes through;
wherein:
the valve unit includes a first spool valve that switches passage and blockage of the heating medium from the first supply channel to the mixing channel, and a second spool valve that switches passage and blockage of the heating medium from the second supply channel to the mixing channel; and
the first spool valve and the second spool valve are coupled through a heat insulating layer.

2. The temperature control apparatus according to claim 1, further comprising a first circulation channel and a second circulation channel, the first circulation channel provides the heating medium going out from the temperature adjusting device to the first spool valve and the second circulation channel provides the heating medium going out from the temperature adjusting device to the second spool valve,
wherein:
the first spool valve is connected to the first circulation channel, while the second spool valve is connected to the second circulation channel;
the first spool valve includes a first outlet port for return from which the heating medium from the first circulation channel goes out to a first return channel, which is connected to the first temperature regulating unit, the first spool valve being configured to switch passage and blockage of the heating medium from the first circulation channel to the first outlet port for return, depending on switching of passage and blockage of the heating medium from the first supply channel to the mixing channel; and
the second spool valve includes a second outlet port for return from which the heating medium from the second circulation channel goes out to a second return channel, which is connected to the second temperature regulating unit, the second spool valve being configured to switch passage and blockage of the heating medium from the second circulation channel to the second outlet port for return, depending on switching of passage and blockage of the heating medium from the second supply channel to the mixing channel.

3. The temperature control apparatus according to claim 2, wherein:
the first spool valve is configured to cause the heating medium to pass from the first circulation channel to the first outlet port for return, when the first spool valve causes the heating medium to pass from the first supply channel to the mixing channel, as well as the first spool valve is configured to block the heating medium from the first circulation channel to the first outlet port for return, when the first spool valve blocks the heating medium from the first supply channel to the mixing channel; and
the second spool valve is configured to cause the heating medium to pass from the second circulation channel to the second outlet port for return, when the second spool valve causes the heating medium to pass from the second supply channel to the mixing channel, as well as the second spool valve is configured to block the heating medium from the second circulation channel to the second outlet port for return, when the second spool valve blocks the heating medium from the second supply channel to the mixing channel.

4. The temperature control apparatus according to claim 3, wherein
the first spool valve further includes a first inlet port for supply connecting to the first supply channel, a first outlet port for supply connecting to the mixing channel, and a first inlet port for return connecting to the first circulation channel;
the first spool valve is configured to connect the first inlet port for supply, through which the heating medium going out from the first supply channel passes, and the first outlet port for return, which is connected to the first temperature regulating unit via the first return channel, when the first spool valve blocks the first inlet port for supply and the first outlet port for supply so as to block the heating medium from the first supply channel to the mixing channel, and blocks the first inlet port for return and the first outlet port for return so as to block the heating medium from the first circulation channel to the first outlet port for return;
the second spool valve further includes a second inlet port for supply connecting to the second supply channel, a second outlet port for supply connecting to the mixing channel, and a second inlet port for return connecting to the second circulation channel; and
the second spool valve is configured to connect the second inlet port for supply, through which the heating medium going out from the second supply channel passes, and the second outlet port for return, which is connected to the second temperature regulating unit via the second return channel, when the second spool valve blocks the second inlet port for supply and the second outlet port for supply so as to block the heating medium from the second supply channel to the mixing channel, and blocks the second inlet port for return and the second outlet port for return so as to block the heating medium from the second circulation channel to the second outlet port for return.

5. The temperature control apparatus according to claim 1, further comprising a valve control device that controls operations of the first spool valve and the second spool valve in the valve unit,
wherein:
when the valve control device controls the first spool valve such that the heating medium passes from the first supply channel to the mixing channel, the valve control device controls the second spool valve such that the heating medium from the second supply channel to the mixing channel is blocked; and
when the valve control device controls the second spool valve such that the heating medium passes from the second supply channel to the mixing channel, the valve control device controls the first spool valve such that the heating medium from the first supply channel to the mixing channel is blocked.

6. The temperature control apparatus according to claim 5, wherein:
each of the first spool valve and the second spool valve has an electromagnetic solenoid that switches two positions depending on an excitation condition and a non-excitation condition, each of the first spool valve and the second spool valve being configured to switch passage and blockage of the heating medium depending on the position of the electromagnetic solenoid; and
when the valve control device controls the electromagnetic solenoid of the first spool valve so as to be in one of the excitation condition and the non-excitation condition, the valve control device controls the electromagnetic solenoid of the second spool valve so as to be in the other one of the excitation condition and the non-excitation condition.

7. The temperature control apparatus according to claim 2, wherein:
the first spool valve is configured to switch passage and blockage of the heating medium from the first supply channel to the mixing channel in such a manner that a flow rate of the heating medium passing from the first supply channel to the mixing channel can be adjusted, while the second spool valve is configured to switch passage and blockage of the heating medium from the second supply channel to the mixing channel in such a manner that a flow rate of the heating medium from the second supply channel to the mixing channel can be adjusted;
the first spool valve further includes a first inlet port for supply connecting to the first supply channel, a first outlet port for supply connecting to the mixing channel, and a first inlet port for return connecting to the first circulation channel;
the first spool valve is configured to adjust a flow rate of the heating medium passing from the first supply channel to the mixing channel by adjusting connection between the first inlet port for supply and the first outlet port for supply at an opening degree between a full open condition and a full close condition, while the first spool valve is configured to adjust a flow rate of the heating medium passing from the first circulation channel to the first outlet port for return to go out therefrom by adjusting connection between the first inlet port for return and the first outlet port for return at an opening degree between a full open condition and a full close condition, in such a manner that the opening degree in the connection between the first inlet port for return and the first outlet port for return increases, as the opening degree in the connection between the first inlet port for supply and the first outlet for supply increases;
the second spool valve further includes a second inlet port for supply connecting to the second supply channel, a second outlet port for supply connecting to the mixing channel, and a second inlet port for return connecting to the second circulation channel; and
the second spool valve is configured to adjust a flow rate of the heating medium passing from the second supply channel to the mixing channel by adjusting connection between the second inlet port for supply and the second outlet port for supply at an opening degree between a full open condition and a full close condition, while the second spool valve is configured to adjust a flow rate of the heating medium passing from the second circulation channel to the second outlet port for return to go out therefrom by adjusting connection between the second inlet port for return and the second outlet port for return at an opening degree between a full open condition and a full close condition, in such a manner that the opening degree in the connection between the second inlet port for return and the second outlet port for return increases, as the opening degree in the connection between the second inlet port for supply and the second outlet port for supply increases.

8. The temperature control apparatus according to claim 7, wherein:
the first spool valve is configured to connect the first inlet port for supply and the first outlet port for return in a full open condition, when the connection between the first inlet port for supply and the first outlet port for supply is in the full close condition and the connection between the first inlet port for return and the first outlet port for return is in the full close condition;
the connection between the first inlet port for supply and the first outlet port for return comes close to a full close condition, as the connection between the first inlet port for supply and the first outlet port for supply and the connection between the first inlet port for return and the first outlet port for return come close to the full open condition, in such a manner that the connection between the first inlet port for supply and the first outlet port for return reaches the full close condition when the connection between the first inlet port for supply and the first outlet port for supply reaches the full open condition and the connection between the first inlet port of return and the first outlet port for return reaches the full open condition;
the second spool valve is configured to connect the second inlet port for supply and the second outlet port for return in a full open condition, when the connection between the second inlet port for supply and the second outlet port for supply is in the full close condition and the connection between the second inlet port for return and the second outlet port for return is in the full close condition; and
the connection between the second inlet port for supply and the second outlet port for return comes close to a full close condition, as connection between the second inlet port for supply and the second outlet port for supply and the connection between the second inlet port for return and the second outlet port for return come close to the full open condition, in such a manner that the connection between the second inlet port for supply and the second outlet port for return reaches the full close condition when the connection between the second inlet port for supply and the second outlet port for supply reaches the full open condition and the second inlet port for return and the connection between the second outlet port for return reaches the full open condition.

9. The temperature control apparatus according to claim 7, further comprising a valve control device that controls operations of the first spool valve and the second spool valve in the valve unit, wherein:
when the valve control device controls an opening degree in the connection between the first inlet port for supply and the first outlet port for supply of the first spool valve at A % that is between 0% and 100%, the valve control device controls an opening degree in the connection between the second inlet port for supply and the second outlet port for supply of the second spool valve at (100-A) %.

10. The temperature control apparatus according to claim 9, wherein
each of the first spool valve and the second spool valve has a proportional solenoid, and the first spool valve is configured to adjust a flow rate depending on driving of the proportional solenoid of the first spool valve, and the second spool valve is configured to adjust a flow rate depending on the driving of the proportional solenoid of the second spool valve.

11. The temperature control apparatus according to claim 2,
wherein:
the first temperature regulating unit further includes:
the first return channel connected to the first outlet port for return, through which the heating medium going out from the first outlet port for return passes;
a first intermediate channel interposed between the first return channel and the first supply channel;
a first cooling device that cools the heating medium at any position in a portion including the first return channel up to an upstream end of the first supply channel; and
a first heating device that heats the heating medium on the downstream side of a cooled position of the first cooling device in the portion including the first return channel up to the upstream end of the first supply channel; and
the heating medium passing through the first supply channel is temperature-controlled by the first cooling device and the first heating device.

12. The temperature control apparatus according to claim 11, wherein:
the first return channel and the first intermediate channel are connected by a first side three-way valve;
the first intermediate channel includes a first side main channel part and thea first side bypass channel part;
the first side three-way valve is connected, at a first port thereof, to a downstream end of the first return channel, is connected, at a second port thereof, to an upstream end of the first side main channel part, and is connected, at a third port thereof, to an upstream end of the first side bypass channel part;
the heating medium passing through the first side main channel part is cooled by the first cooling device;
a downstream end of the first side main channel part is connected to the first heating device;
the first heating device receives and heats the heating medium going out from the first side main channel part; and
the first side bypass channel part is connected to a position that is on the downstream side of the cooled position of the first cooling device in the first side main channel part and on the upstream side of the connection position to the first heating device.

13. The temperature control apparatus according to claim 11, wherein:
the second temperature regulating unit further includes:
the second return channel connected to the second outlet port for return, through which the heating medium going out from the second outlet port for return passes;
a second intermediate channel interposed between the second return channel and the second supply channel;
a second cooling device that cools the heating medium at any position in a portion including the second return channel up to an upstream end of the second supply channel; and
a second heating device that heats the heating medium on the downstream side of a cooled position of the second cooling device in the portion including the second return channel up to the upstream end of the second supply channel; and
the heating medium passing through the second supply channel is temperature-controlled by the second cooling device and the second heating device.

14. The temperature control apparatus according to claim 13, wherein:
the second return channel and the second intermediate channel are connected by a second side three-way valve;
the second intermediate channel includes a second side main channel part and a second side bypass channel part;
the second side three-way valve is connected, at a first port thereof, to a downstream end of the second return channel, is connected, at a second port thereof, to an upstream end of the second side main channel part, and is connected, at a third port thereof, to an upstream end of the second side bypass channel part;
the heating medium passing through the second side main channel part is cooled by the second cooling device;
a downstream end of the second side main channel part is connected to the second heating device;
the second heating device receives and heats the heating medium going out from the second side main channel part; and
the second side bypass channel part is connected to a position that is on the downstream side of the cooled position of the second cooling device in the second side main channel part and on the upstream side of the connection position to the second heating device.

15. The temperature control apparatus according to claim 2, further comprising, in addition to the first circulation channel and the second circulation channel, a third circulation channel that extends and diverges from the temperature adjusting device, through which the heating medium going out from the temperature adjusting device passes,
wherein:
the valve unit further includes a third spool valve connected to the third circulation channel;
the third spool valve has a third outlet port for return through which the heating medium from the third circulation channel goes out, and is configured to switch passage and blockage of the heating medium from the third circulation channel to the third outlet port for return; and
the third outlet port for return is connected to the mixing channel.

16. The temperature control apparatus according to claim 15, wherein
the third spool valve is connected to the first spool valve and the second spool valve.

17. The temperature control apparatus according to claim 1, wherein:
the first spool valve includes a first valve body having a spool hole formed therein, and a first spool inserted into the spool hole of the first valve body;

the second spool valve includes a second valve body having a spool hole formed therein, and a second spool inserted into the spool hole of the second valve body; and the first spool valve and the second spool valve are located such that the first spool and the second spool are coaxial, and the heat insulating layer is disposed between an end of the first valve body and an end of the second valve body, the ends facing with each other.

18. A temperature control apparatus comprising:

a first temperature regulating unit including a first supply channel through which a heating medium passes;

a second temperature regulating unit including a second supply channel through which a heating medium passes, the heating medium being controlled at a temperature different from that of the heating medium passing through the first supply channel;

a valve unit connected to the first supply channel and the second supply channel;

a mixing channel connected to the valve unit, the mixing channel including a mixing unit body through which at least one of the heating medium passing through the first supply channel to go out from the valve unit, and the heating medium passing through the second supply channel to go out from the valve unit, passes; and a temperature adjusting device in which the heating medium going out from the mixing channel passes through;

wherein:

the valve unit includes a first spool valve that switches passage and blockage of the heating medium from the first supply channel to the mixing channel, and a second spool valve that switches passage and blockage of the heating medium from the second supply channel to the mixing channel, the first spool valve and the second spool valve being coupled to each other, the temperature control apparatus further comprises a first circulation channel and a second circulation channel, the first circulation channel provides the heating medium going out from the temperature adjusting device to the first spool valve and the second circulation channel provides the heating medium going out from the temperature adjusting device to the second spool valve;

the first spool valve is connected to the first circulation channel, while the second spool valve is connected to the second circulation channel;

the first spool valve includes a first outlet port for return from which the heating medium from the first circulation channel goes out to a first return channel, which is connected to the first temperature regulating unit, the first spool valve being configured to switch passage and blockage of the heating medium from the first circulation channel to the first outlet port for return, depending on switching of passage and blockage of the heating medium from the first supply channel to the mixing channel; and the second spool valve includes a second outlet port for return from which the heating medium from the second circulation channel goes out to a second return channel, which is connected to the second temperature regulating unit, the second spool valve being configured to switch passage and blockage of the heating medium from the second circulation channel to the second outlet port for return, depending on switching of passage and blockage of the heating medium from the second supply channel to the mixing channel.

* * * * *